United States Patent
Xia et al.

(10) Patent No.: US 8,963,132 B2
(45) Date of Patent: Feb. 24, 2015

(54) SOLUTION PROCESSABLE DOPED TRIARYLAMINE HOLE INJECTION MATERIALS

(75) Inventors: Chuanjun Xia, Lawrenceville, NJ (US); Kwang Ohk Cheon, Holland, PA (US)

(73) Assignee: Universal Display Corporation, Ewing, NJ (US)

( * ) Notice: Subject to any disclaimer, the term of this patent is extended or adjusted under 35 U.S.C. 154(b) by 239 days.

(21) Appl. No.: 13/583,539

(22) PCT Filed: Mar. 25, 2010

(86) PCT No.: PCT/US2010/028676
§ 371 (c)(1),
(2), (4) Date: Nov. 27, 2012

(87) PCT Pub. No.: WO2011/119162
PCT Pub. Date: Sep. 29, 2011

(65) Prior Publication Data
US 2013/0112951 A1  May 9, 2013

(51) Int. Cl.
*H01L 35/24* (2006.01)
*H01L 51/00* (2006.01)
(Continued)

(52) U.S. Cl.
CPC .......... *H01L 51/0062* (2013.01); *H01L 51/002* (2013.01); *H01L 51/0061* (2013.01); *H01L 51/5052* (2013.01); *H01L 51/5088* (2013.01); *H01L 51/56* (2013.01); *H01L 51/0003* (2013.01); *H01L 51/0026* (2013.01); *H01L 51/0037* (2013.01); *H01L 51/0054* (2013.01); *H01L 51/0059* (2013.01); *H01L 51/0072* (2013.01); *H01L 51/0081* (2013.01); *H01L 51/0085* (2013.01); *H01L 2251/308* (2013.01)
USPC ..................................... 257/40; 257/E51.001

(58) Field of Classification Search
USPC ............................................ 257/40, E51.001
See application file for complete search history.

(56) References Cited

U.S. PATENT DOCUMENTS

| 4,769,292 A | 9/1988 | Tang et al. |
| 5,061,569 A | 10/1991 | VanSlyke et al. |
| 5,247,190 A | 9/1993 | Friend et al. |

(Continued)

FOREIGN PATENT DOCUMENTS

| EP | 0650955 | 5/1995 |
| EP | 1 661 888 A1 | 5/2006 |

(Continued)

OTHER PUBLICATIONS

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," *Adv. Mater*, 6(9):677-679 (1994).

(Continued)

*Primary Examiner* — Anthony Ho
(74) *Attorney, Agent, or Firm* — Duane Morris LLP

(57) ABSTRACT

Methods for fabricating a solution-processed OLED are provided. The methods include depositing an organic layer comprising mixture of an organic electron acceptor and an organic electron donor to form a layer that is insoluble to a non-polar solvent. Devices containing the organic layer may demonstrate improved lifetime and have a lower operating voltage while maintaining good luminous efficiency.

20 Claims, 3 Drawing Sheets

(51) Int. Cl.
*H01L 51/50* (2006.01)
*H01L 51/56* (2006.01)

(56) References Cited

U.S. PATENT DOCUMENTS

| | | | |
|---|---|---|---|
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,344,283 | B1 | 2/2002 | Inoue et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0181874 | A1 | 8/2007 | Prakash et al. |
| 2007/0190359 | A1 | 8/2007 | Knowles et al. |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0038583 | A1 | 2/2008 | Itai et al. |
| 2008/0038587 | A1 | 2/2008 | Shih-Wen et al. |
| 2008/0106190 | A1 | 5/2008 | Yabunouchi et al. |
| 2008/0107919 | A1 | 5/2008 | Hwang et al. |
| 2008/0124572 | A1 | 5/2008 | Mizuki et al. |
| 2008/0206597 | A1 | 8/2008 | Iwakuma |
| 2008/0220265 | A1 | 9/2008 | Xia et al. |
| 2008/0224595 | A1 | 9/2008 | Nakamata et al. |
| 2008/0233387 | A1 | 9/2008 | Kambe et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2009/0206744 | A1 | 8/2009 | Lim et al. |
| 2010/0044686 | A1 | 2/2010 | Morishita |

FOREIGN PATENT DOCUMENTS

| | | |
|---|---|---|
| EP | 1725079 | 11/2006 |
| EP | 1862524 | 12/2007 |
| EP | 1 950 817 A1 | 7/2008 |
| EP | 2034538 | 3/2009 |
| JP | 200511610 | 1/2005 |
| JP | 2006-151979 A | 6/2006 |
| JP | 2007123392 | 5/2007 |
| JP | 2007254297 | 10/2007 |
| JP | 2008-198365 A | 8/2008 |
| JP | 2009-123696 A | 6/2009 |
| JP | 2009-200498 A | 9/2009 |
| JP | 2008074939 | 10/2009 |
| WO | WO 0139234 | 5/2001 |
| WO | WO 0202714 | 1/2002 |
| WO | WO 0215645 | 2/2002 |
| WO | WO 03040257 | 5/2003 |
| WO | WO 03060956 | 7/2003 |
| WO | WO 2004093207 | 10/2004 |
| WO | WO 2004107822 | 12/2004 |
| WO | WO 2005014551 | 2/2005 |
| WO | WO 2005019373 | 3/2005 |
| WO | WO 2005030900 | 4/2005 |
| WO | WO 2005089025 | 9/2005 |
| WO | WO 2005123873 | 12/2005 |
| WO | WO 2006009024 | 1/2006 |
| WO | WO 2006056418 | 6/2006 |
| WO | WO 2006072002 | 7/2006 |
| WO | WO 2006082742 | 8/2006 |
| WO | WO 2006098120 | 9/2006 |
| WO | WO 2006100298 | 9/2006 |
| WO | WO 2006103874 | 10/2006 |
| WO | WO 2006114966 | 11/2006 |
| WO | WO 2006132173 | 12/2006 |
| WO | WO 2007002683 | 1/2007 |
| WO | WO 2007004380 | 1/2007 |
| WO | WO 2007/029806 A1 | 3/2007 |
| WO | WO 2007/058172 A1 | 5/2007 |
| WO | WO 2007063754 | 6/2007 |
| WO | WO 2007063796 | 6/2007 |
| WO | WO 2007/105906 | 9/2007 |
| WO | WO 2008056746 | 5/2008 |
| WO | WO 2008101842 | 8/2008 |
| WO | WO 2008132085 | 11/2008 |
| WO | WO 2009000673 | 12/2008 |
| WO | WO 2009003898 | 1/2009 |
| WO | WO 2009008311 | 1/2009 |
| WO | WO 2009018009 | 2/2009 |
| WO | WO 2009050290 | 4/2009 |
| WO | WO 2009021126 | 5/2009 |
| WO | WO 2009062578 | 5/2009 |
| WO | WO 2009063833 | 5/2009 |
| WO | WO 2009066778 | 5/2009 |
| WO | WO 2009066779 | 5/2009 |
| WO | WO 2009086028 | 7/2009 |
| WO | WO 2009100991 | 8/2009 |

OTHER PUBLICATIONS

Paulose, Betty Marie Jennifer S. et al., "First Examples of Alkenyl Pyridines as Organic Ligands for Phosphorescent Iridium Complexes," *Adv. Mater*, 16(22):2003-2007 (2004).

(56) References Cited

OTHER PUBLICATIONS

Tung, Yung-Liang et al., "Organic Light-Emitting Diodes Based on Charge-Neutral Ru$^{II}$ PHosphorescent Emitters," *Adv. Mater.*, 17(8):1059-1064 (2005).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," *Adv. Mater.*, 19:739-743 (2007).

Wong, Wai-Yeung, "Multifunctional Iridium Complexes Based on Carbazole Modules as Highly Efficient Electrophosphors," *Angew. Chem. Int. Ed.*, 45:7800-7803 (2006).

Tang, C.W. and VanSlyke, S.A., "Organic Electroluminescent Diodes," *Appl. Phys. Lett.*, 51(12):913-915 (1987).

Adachi, Chihaya et al., "Organic Electroluminescent Device Having a Hole Conductor as an Emitting Layer," *Appl. Phys. Lett.*, 55(15):1489-1491 (1989).

Ma, Yuguang et al., "Triplet Luminescent Dinuclear-Gold(I) Complex-Based Light-Emitting Diodes with Low Turn-On voltage," *Appl. Phys. Lett.*, 74(10):1361-1363 (1999).

Gao, Zhiqiang et al., "Bright-Blue Electroluminescence From a Silyl-Substituted ter-(phenylene-vinylene) derivative," *Appl. Phys. Lett.*, 74(6):865-867 (1999).

Lee, Chang-Lyoul et al., "Polymer Phosphorescent Light-Emitting Devices Doped with Tris(2-phenylpyridine) Iridium as a Triplet Emitter," *Appl. Phys. Lett.*, 77(15):2280-2282 (2000).

Hung, L.S. et al., "Anode Modification in Organic Light-Emitting Diodes by Low-Frequency Plasma Polymerization of CHF$_3$,"*Appl. Phys. Lett.*, 78(5):673-675 (2001).

Ikai, Masamichi and Tokito, Shizuo, "Highly Efficient Phosphorescence From Organic Light-Emitting Devices with an Exciton-Block Layer," *Appl. Phys. Lett.*, 79(2):156-158 (2001).

Wang, Y. et al., "Highly Efficient Electroluminescent Materials Based on Fluorinated Organometallic Iridium Compounds," *Appl. Phys. Lett.*, 79(4):449-451 (2001).

Kwong, Raymond C. et al., "High Operational Stability of Electrophosphorescent Devices," *Appl. Phys. Lett.*, 81(1):162-164 (2002).

Holmes, R.J. et al., "Blue Organic Electrophosphorescence Using Exothermic Host-Guest Energy Transfer," *Appl. Phys. Lett.*, 82(15):2422-2424 (2003).

Sotoyama, Wataru et al., "Efficient Organic Light-Emitting Diodes with Phosphorescent Platinum Complexes Containing N^C^N-Coordinating Tridentate Ligand," *Appl. Phys. Lett.*, 86:153505-1-153505-3 (2005).

Okumoto, Kenji et al., "Green Fluorescent Organic Light-Emitting Device with External Quantum Efficiency of Nearly 10%," *Appl. Phys. Lett.*, 89:063504-1-063504-3 (2006).

Kanno, Hiroshi et al., "Highly Efficient and Stable Red Phosphorescent Organic Light-Emitting Device Using bis[2-(2-benzothiazoyl)phenolato]zinc(II) as host material," *Appl. Phys. Lett.*, 90:123509-1-123509-3 (2007).

Aonuma, Masaki et al., "Material Design of Hole Transport Materials Capable of Thick-Film Formation in Organic Light Emitting Diodes," *Appl. Phys. Lett.*, 90:183503-1-183503-3 (2007).

Sun, Yiru and Forrest, Stephen R., "High-Efficiency White Organic Light Emitting Devices with Three Separate Phosphorescent Emission Layers," *Appl. Phys. Lett.*, 91:263503-1-263503-3 (2007).

Adachi, Chihaya et al., "High-Efficiency Red Electrophosphorescence Devices," *Appl. Phys. Lett.*, 78(11):1622-1624 (2001).

Wong, Keith Man-Chung et al., A Novel Class of Phosphorescent Gold(III) Alkynyl-Based Organic Light-Emitting Devices with Tunable Colour, *Chem. Commun.*, 2906-2908 (2005).

Hamada, Yuji et al., "High Luminance in Organic Electroluminescent Devices with Bis(10-hydroxybenzo[h]quinolinato)beryllium as an Emitter," *Chem. Lett.*, 905-906 (1993).

Nishida, Jun-ichi et al., "Preparation, Characterization, and Electroluminescence Characteristics of α-Diimine-type Platinum(II) Complexes with Perfluorinated Phenyl Groups as Ligands," *Chem. Lett.*, 34(4):592-593 (2005).

Mi, Bao-Xiu et al., "Thermally Stable Hole-Transporting Material for Organic Light-Emitting Diode: an Isoindole Derivative," *Chem. Mater.*, 15(16):3148-3151 (2003).

Huang, Wei-Sheng et al., "Highly Phosphorescent Bis-Cyclometalated Iridium Complexes Containing Benzoimidazole-Based Ligands," *Chem. Mater.*, 16(12):2480-2488 (2004).

Niu, Yu-Hua et al., "Highly Efficient Electrophosphorescent Devices with Saturated Red Emission from a Neutral Osmium Complex," *Chem. Mater.*, 17(13):3532-3536 (2005).

Lo, Shih-Chun et al., "Blue Phosphorescence from Iridium(III) Complexes at Room Temperature," *Chem. Mater.*, 18(21):5119-5129 (2006).

Takizawa, Shin-ya et al., "Phosphorescent Iridium Complexes Based on 2-Phenylimidazo[1,2-α]pyridine Ligands: Tuning of Emission Color toward the Blue Region and Application to Polymer Light-Emitting Devices," *Inorg. Chem.*, 46(10):4308-4319 (2007).

Lamansky, Sergey et al., "Synthesis and Characterization of Phosphorescent Cyclometalated Iridium Complexes," *Inorg. Chem.*, 40(7):1704-1711 (2001).

Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).

Noda, Tetsuya and Shirota,Yasuhiko, "5,5'-Bis(dimesitylboryl)-2,2'-bithiophene and 5,5''-Bis(dimesitylboryl)-2,2':5',2''-terthiophene as a Novel Family of Electron-Transporting Amorphous Molecular Materials," *J. Am. Chem. Soc.*, 120 (37):9714-9715 (1998).

Sakamoto,Youichi et al., "Synthesis, Characterization, and Electron-Transport Property of Perfluorinated Phenylene Dendrimers," *J. Am. Chem. Soc.*, 122(8):1832-1833 (2000).

Adachi, Chihaya et al., "Nearly 100% Internal Phosphorescence Efficiency in an Organic Light Emitting Device," *J. Appl. Phys.*, 90(10):5048-5051 (2001).

Shirota, Yasuhiko et al., "Starburst Molecules Based on π-Electron Systems as Materials for Organic Electroluminescent Devices," *Journal of Luminescence*, 72-74:985-991 (1997).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).

Kido, Junji et al., 1,2,4-Triazole Derivative as an Electron Transport Layer in Organic Electroluminescent Devices, *Jpn. J. Appl. Phys.*, 32:L917-L920 (1993).

Van Slyke, S. A. et al., "Organic Electroluminescent Devices with Improved Stability," *Appl. Phys. Lett.*, 69(15 ):2160-2162 (1996).

Guo, Tzung-Fang et al., "Highly Efficient Electrophosphorescent Polymer Light-Emitting Devices," *Organic Electronics*, 1:15-20 (2000).

Palilis, Leonidas C., "High Efficiency Molecular Organic Light-Emitting Diodes Based on Silole Derivatives and Their Exciplexes," *Organic Electronics*, 4:113-121 (2003).

Ikeda, Hisao et al., "P-185: Low-Drive-Voltage OLEDs with a Buffer Layer Having Molybdenum Oxide," *SID Symposium Digest*, 37:923-926 (2006).

T. Östergård et al., "Langmuir-Blodgett Light-Emitting Diodes of Poly(3-Hexylthiophene): Electro-Optical Characteristics Related to Structure," *Synthetic Metals*, 87:171-177 (1997).

Hu, Nan-Xing et al., "Novel High $T_g$ Hole-Transport Molecules Based on Indolo[3,2-b]carbazoles for Organic Light-Emitting Devices," *Synthetic Metals*, 111-112:421-424 (2000).

Salbeck, J. et al., "Low Molecular Organic Glasses for Blue Electroluminescence," *Synthetic Metals*, 91:209-215 (1997).

Baldo et al., "Highly Efficient Phosphorescent Emission from Organic Electroluminescent Devices," *Nature*, vol. 395, 151-154, (1998).

Baldo et al., "Very high-efficiency green organic light-emitting devices based on electrophosphorescence," Appl. Phys. Lett., vol. 75, No. 3, 4-6 (1999).

Walzer et al., "Chemical Review", 107, 1233 (2007).

Suzuki et al., "SID Digest", 1840-1843 (2007).

Zhang, et al., "Improving the stability of organic light-emitting devices using a solution-processed hole-injecting layer", Applied Surface Science, vol. 255, (May 6, 2009).

(56) References Cited

OTHER PUBLICATIONS

The International Search Report corresponding to the PCT/US2010/028676 application.
Japanese Office Action, Appl. No. 2013-501226, dated Jan. 21, 2014 (7 pages).
English-language Abstract of Japanese Patent Publication No. JP 2008-198365 A, European Patent Office, Espacenet database—Worldwide (2014).
English-language Abstract of Japanese Patent Publication No. JP 2009-123696 A, European Patent Office, Espacenet database—Worldwide (2014).
Taiwanese Search Report, Appl. No. 100110225, dated Sep. 18, 2014.

SOLUTION PROCESSABLE DOPED TRIARYLAMINE HOLE INJECTION MATERIALS

This application is a national stage application of, and claims priority to, International Application No. PCT/US2010/028676 filed Mar. 25, 2010, the disclosure of which is hereby expressly incorporated herein by reference in its entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs). More specifically, the present invention relates to methods for fabricating a device containing an organic layer comprising an organic electron donor and an organic electron acceptor that forms a layer insoluble to a non-polar solvent, and devices containing the organic layer.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the structure:

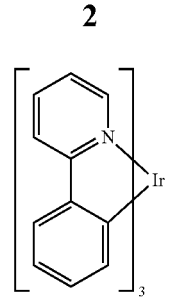

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A method of fabricating an organic light emitting device is provided. The method comprises providing an electrode, depositing a first organic layer in contact with the electrode by a solution process, and heating the first organic layer to form a layer that is insoluble in a non-polar solvent. Preferably, the electrode is an anode, and the first organic layer is deposited in contact with the anode.

The first organic layer comprises an organic electron acceptor and an organic electron donor having the formula:

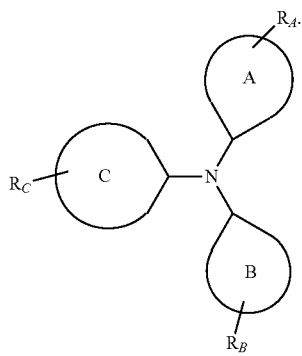

A, B, and C are 5 or 6 membered cyclic or heterocyclic rings. $R_A$, $R_B$, and $R_C$ are independent selected from the group consisting of hydrogen, halogen, alkyl, alkoxy, amino, alkenyl, alkynyl, aryl and heteroaryl. $R_A$, $R_B$, and $R_C$ are optionally fused to A, B, and C. At least two of $R_A$, $R_B$, and $R_C$ contain the structure:

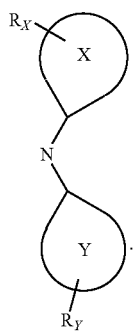

X and Y are independently 5 or 6 membered cyclic or heterocyclic rings. $R_X$ and $R_Y$ are independently selected from the group consisting of hydrogen, halogen, alkyl, alkoxy, amino, alkenyl, alkynyl, aryl and heteroaryl. $R_X$ and $R_Y$ are optionally fused to X and Y. $R_X$ and $R_Y$ are optionally connected to A and B.

In one aspect, the organic electron donor has the formula:

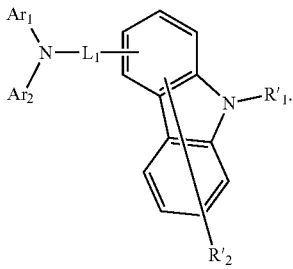

$L_1$ represents a substituted or unsubstituted arylene group having 6 to 60 carbon atoms forming the aromatic ring, a substituted or unsubstituted fluorenylene group, or a substituted or unsubstituted heteroarylene group having 5 to 60 atoms forming a ring; $Ar_1$ and $Ar_2$ each independently represents a substituted or unsubstituted aryl group having 6 to 60 carbon atoms forming the aromatic ring or a substituted or unsubstituted heteroaryl group having 5 to 60 atoms forming a ring; $R'_1$ represents a substituted or unsubstituted aryl group having 6 to 60 carbon atoms forming the aromatic ring; $R'_2$ represents a hydrogen atom, a substituted or unsubstituted aryl group having 6 to 60 carbon atoms forming the aromatic ring, a substituted or unsubstituted alkyl group having 1 to 50 carbon atoms, a substituted or unsubstituted alkoxy group having 1 to 50 carbon atoms, a substituted or unsubstituted aryloxy group having 6 to 50 atoms forming a ring, a substituted or unsubstituted arylthio group having 5 to 50 atoms forming a ring, a substituted or unsubstituted alkoxycarbonyl group having 2 to 50 carbon atoms, an amino group substituted by a substituted or unsubstituted aryl group having 6 to 50 carbon atoms forming the aromatic ring, a halogen atom, a cyano group, a nitro group, a hydroxyl group or a carboxyl group; with the proviso that neither $Ar_1$ nor $Ar_2$ contains a fluorene structure, and that the number of a carbazole structures in the aromatic amine derivative represented by the formula is 1 or 2.

In another aspect, the organic electron donor has the formula:

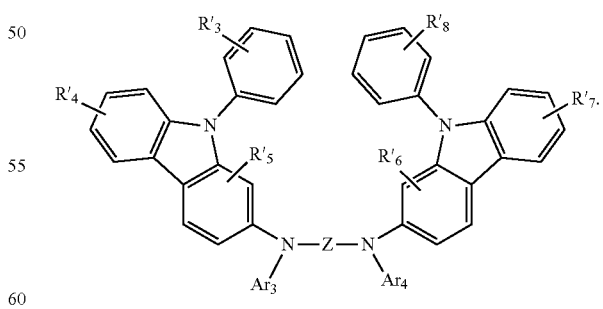

Z is selected from the group consisting of a substituted or unsubstituted C1-C30 alkylene group, a substituted or unsubstituted C2-C30 alkenylene group, a substituted or unsubstituted C6-C30 arylene group, a substituted or unsubstituted C2-C30 heteroarylene group, and a substituted or unsubstituted C2-C30 heterocyclic group; each of $R'_3$, $R'_4$, $R'_5$, $R'_6$, R'$_7$, and R'$_8$ is independently selected from the group consisting of a hydrogen atom, a substituted or unsubstituted C1-C30 alkyl group, a substituted or unsubstituted C1-C30 alkoxy group, a substituted or unsubstituted C6-C30 aryl group, a substituted or unsubstituted C6-C30 aryloxy group, a substituted or unsubstituted C2-C30 heterocyclic group, a substituted or unsubstituted C6-C30 condensed polycyclic group, a hydroxy group, a cyano group, and a substituted or unsubstituted amino group, and, alternatively, two or more adjacent groups among R'$_3$, R'$_4$, R'$_5$, R'$_6$, R'$_7$, and R'$_8$ can be connected to each other to form a saturated or unsaturated carbocycle; and wherein each of Ar$_3$ and Ar$_4$ are independently a substituted or unsubstituted C6-C30 aryl group or a substituted or unsubstituted C2-C30 heteroaryl group.

In yet another aspect, the organic electron donor has the formula:

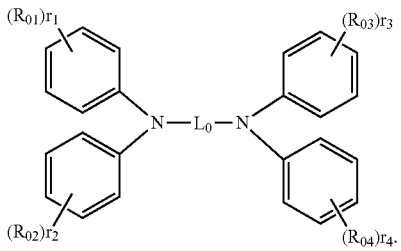

L$_0$ is any one of o-, p-, and m-phenylene groups which have two, three or four rings and which have a substituent with the proviso that when L$_0$ is a phenylene group having four rings, the phenylene group may have an unsubstituted or substituted aminophenyl group somewhere therein, and R$_{01}$, R$_{02}$, R$_{03}$ and R$_{04}$ are any one of the following groups:

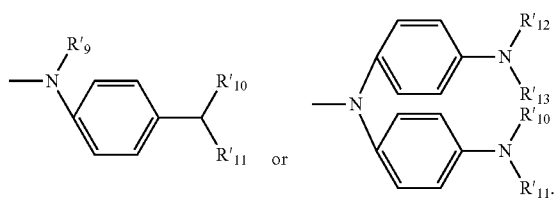

R'$_9$, R'$_{10}$, R'$_{11}$, R'$_{12}$ and R'$_{13}$ are each a substituted or unsubstituted aryl group, and r$_1$, r$_2$, r$_3$ and r$_4$ are each an integer of 0 to 5 with the proviso that r$_1$+r$_2$+r$_3$+r$_4$≥1.

In one aspect, the organic electron acceptor is selected from the group consisting of:

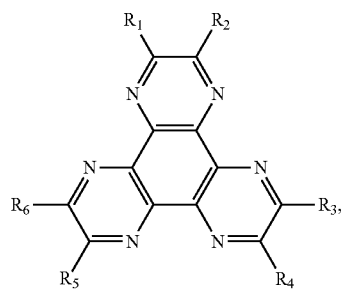

R$_1$, R$_2$, R$_3$, R$_4$, R$_5$, and R$_6$ are independently chosen from the group consisting of hydrogen, halogen, nitrile, nitro, sulfonyl, solfoxide, sulfonamide, sulfonate, trifluoromethyl, ester, amide, straight-chain or branched C1-C12 alkoxy, straight-chain or branched C1-C12 alkyl, aromatic or non-aromatic (substituted or unsubstituted) heterocyclic, substituted or unsubstituted aryl, mono- or di-(substituted or unsibstituted)aryl-amine, and (substituted or unsubstituted)alkyl-(substituted or unsubstituted)aryl-amine; or where R$_1$ and R$_2$, R$_3$ and R$_4$, and R$_5$ and R$_6$ combine form a ring structure including an aromatic ring, a heteroaromatic ring, or a non-aromatic ring, and each ring is substituted or unsubstituted;

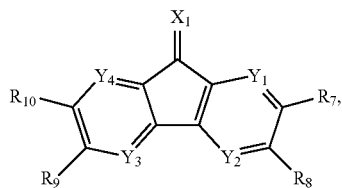

Y$_1$ to Y$_4$ are independently a carbon atom or a nitrogen atom. R$_7$ to R$_{10}$ are independently a hydrogen atom, an alkyl group, a substituted or unsubstituted aryl group, a substituted or unsubstituted heterocycle, a halogen atom, a fluoroalkyl group or a cyano group. R$_7$ and R$_8$, and R$_9$ and R$_{10}$ are independently bonded to form a substituted or unsubstituted aromatic ring or a substituted or unsubstituted heterocycle. X$_1$ is selected from the group consisting of:

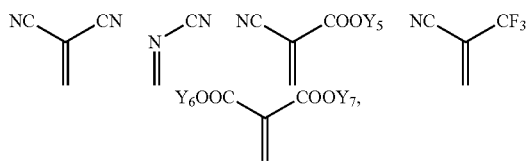

Y$_5$ to Y$_7$ are independently a hydrogen atom, a fluoroalkyl group, an alkyl group, an aryl group or a heterocyclic group; and Y$_6$ and Y$_7$ may form a ring;

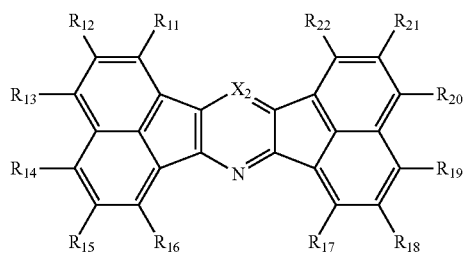

X$_2$ is

C(R$_{23}$) or N, R$_{11}$ to R$_{23}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 40 carbon atoms, a trialkylsilyl group wherein the alkyl group has 1 to 20 carbon atoms and may have a substituent, an aryloxy group wherein the aryl group has 6 to 40 carbon atoms and may have a substituent, a halogen atom, or a cyano group, provided that at least two of $R_{11}$ to $R_{23}$ each represent a cyano group, a trifluoromethyl group or a fluorine atom and that those of $R_{11}$ to $R_{23}$, which are adjacent to one another, may be linked together to form a ring structure;

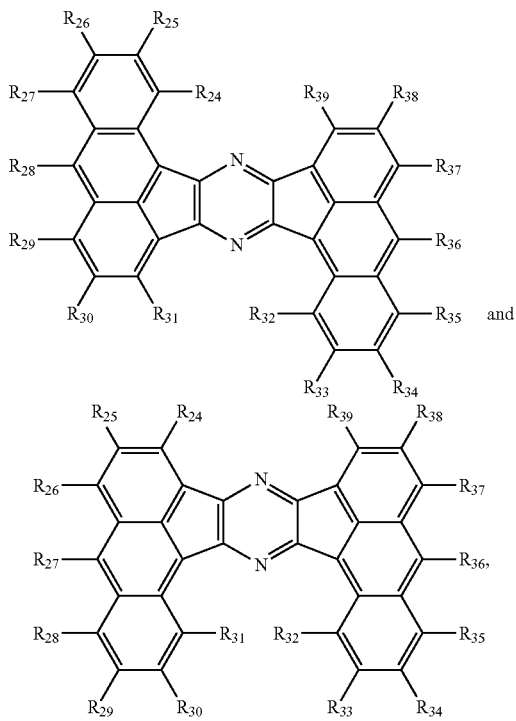

$R_{24}$ to $R_{39}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 40 carbon atoms, a trialkylsilyl group wherein the alkyl group has 1 to 20 carbon atoms and may have a substituent, an aryloxy group wherein the aryl group has 6 to 40 carbon atoms and may have a substituent, a halogen atom, or a cyano group, provided that at least two of $R_{24}$ to $R_{39}$ each represent a cyano group, a trifluoromethyl group or a fluorine atom and that those of $R_{24}$ to $R_{39}$ which are adjacent to one another, may be linked together to form a ring structure;

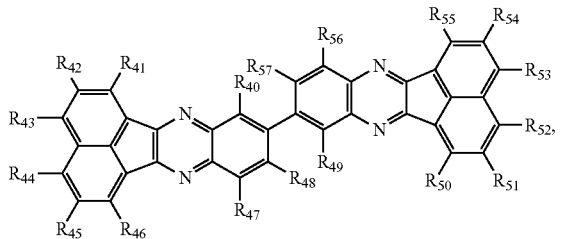

$R_{40}$ to $R_{57}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 40 carbon atoms, a trialkylsilyl group wherein the alkyl group has 1 to 20 carbon atoms and may have a substituent, an aryloxy group wherein the aryl group has 6 to 40 carbon atoms and may have a substituent, a halogen atom, or a cyano group, provided that at least two of $R_{40}$ to $R_{57}$ each represent a cyano group, a trifluoromethyl group or a fluorine atom and that those of $R_{40}$ to $R_{57}$ which are adjacent to one another, may be linked together to form a ring structure; and

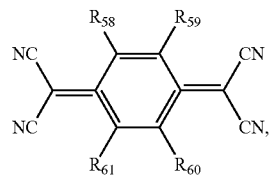

$R_{58}$-$R_{61}$ independently represents hydrogen, fluorine, or substituents independently selected from nitrile (—CN), nitro (—NO$_2$), sulfonyl (—SO$_2$R), sulfoxide (—SOR), trifluoromethyl (—CF$_3$), ester (—CO-DR), amide (—CONHR or —CO—NRR'), substituted or unsubstituted aryl, substituted or unsubstituted heteroaryl, or substituted or unsubstituted alkyl, where R and R' include substituted or unsubstituted alkyl or aryl; or $R_{58}$ and $R_{59}$, or $R_{60}$ and $R_{61}$, combine form a ring structure including an aromatic ring, a heteroaromatic ring, or a non-aromatic ring, and each ring is substituted or unsubstituted.

Preferably, the organic electron acceptor is:

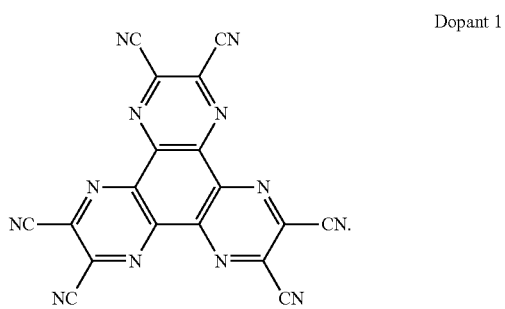 [SMILES: N#Cc1nc2c3nc(C#N)c(C#N)nc3c3nc(C#N)c(C#N)nc3c2nc1C#N]

Dopant 1

Preferably, the organic electron donor is selected from the group consisting of:

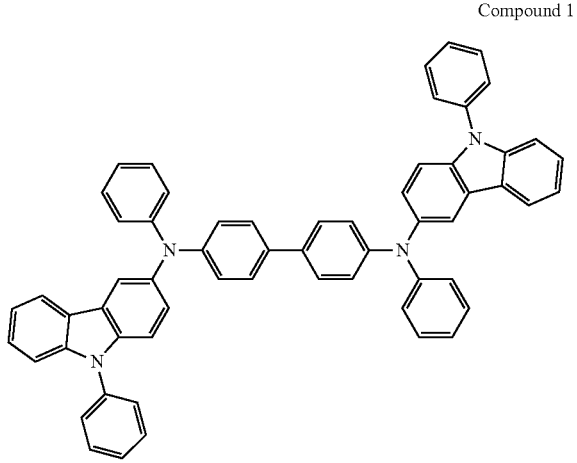

Compound 1

-continued
Compound 2
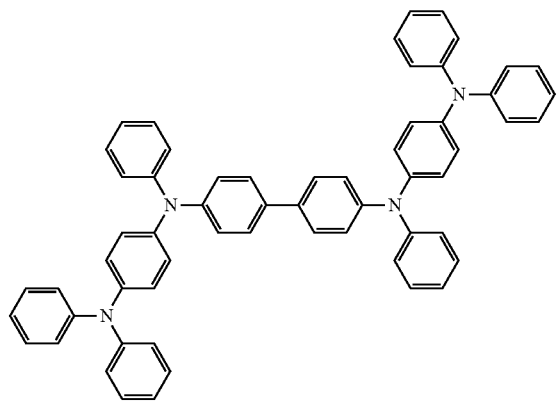
Compound 3
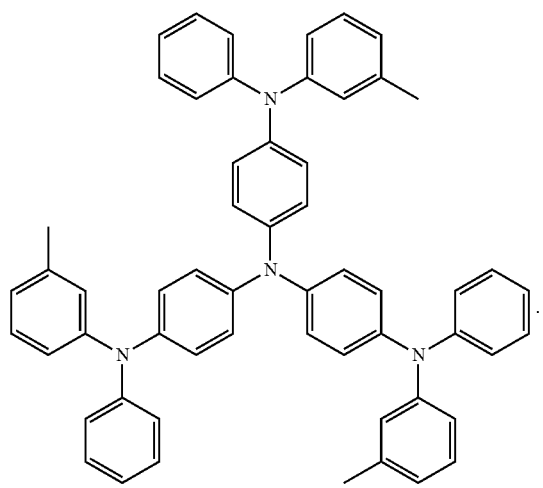
More preferably, the organic electron acceptor is:
Dopant 1
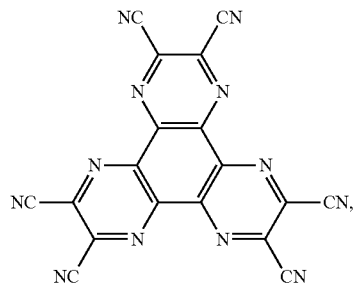
and
the organic electron donor is selected from the group consisting of:
Compound 1
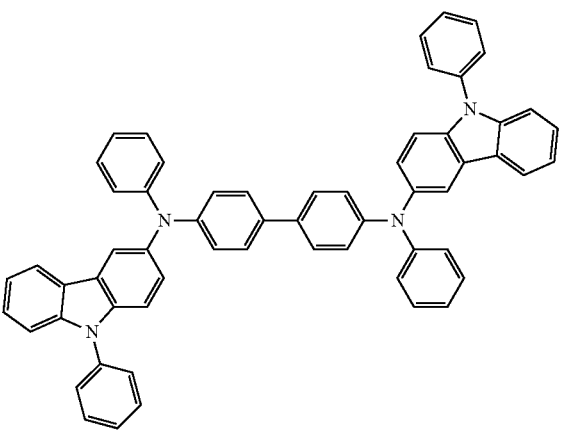
Compound 2
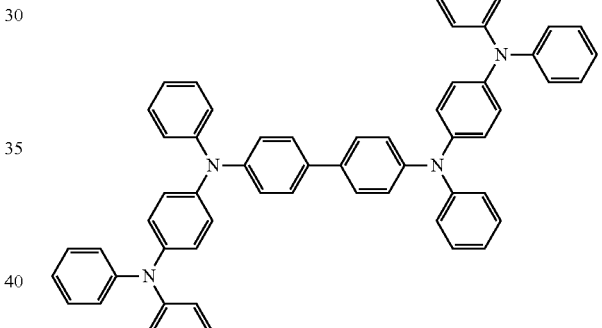
Compound 3
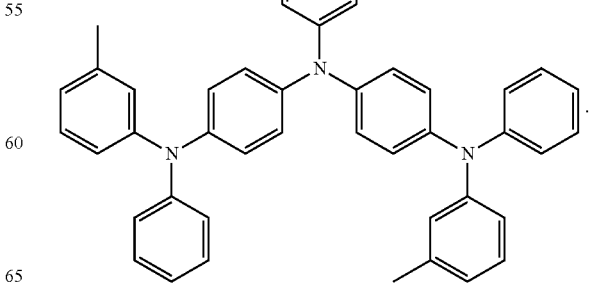

Most preferably, the organic electron acceptor is Dopant 1 and the organic electron donor is:

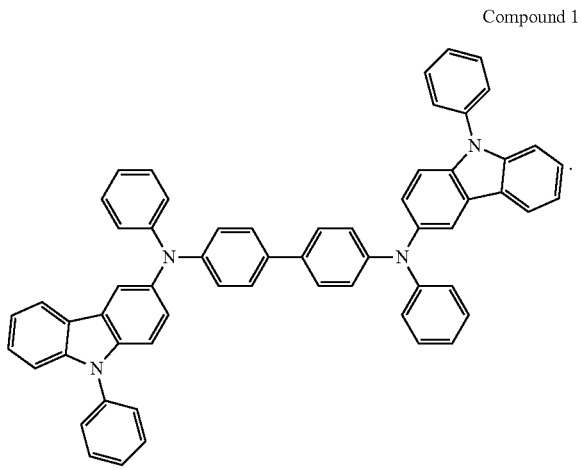 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1]

Compound 1

In one aspect, a second organic layer containing a non-polar solvent is deposited over the first organic layer, and the first organic layer is insoluble to the non-polar solvent in the second organic layer. Preferably, the first organic layer is a hole injection layer. Preferably, the second organic layer is a hole transporting layer, a hole blocking layer, an electron transporting layer, an electron injection layer, or an emissive layer.

Non-polar solvents, as used herein, have a polarity index equal to or less than 3.5. In one aspect, the non-polar solvent is selected from the group consisting of benzene, carbon tetrachloride, cyclohexane, 1,2-dichloroethane, dichloromethane, di-ethyl ether, heptane, hexane, methyl-t-butyl ether, pentane, di-iso-propyl ether, toluene, and xylene. Preferably, the non-polar solvent is toluene.

In one aspect, the solution process is spin coating or inkjet printing.

In another aspect, the organic electron acceptor and the organic electron donor are mixed at a mole ratio of 1:1 or 2:1.

In yet another aspect, the insoluble organic layer forms when the composition is heated at a temperature no less than about 100° C. and no more than about 250° C.

Additionally, a first device is provided, the device comprising an organic light emitting device, which further comprises an anode; a cathode; and a first organic layer disposed between the anode and the cathode, the organic layer comprising an electron acceptor and an electron donor. Selections for the substituents, solvents, organic electron acceptor and organic electron donor mole ratio, and temperature described as preferred for the method are also preferred for use in a device that comprises an organic layer comprising the electron acceptor and the electron donor. These selections include those described at least for A, B, C, $R_A$, $R_B$, $R_C$, X, Y, $R_X$, $R_Y$, $R_1$-$R_{61}$, $Y_1$-$Y_7$, $X_1$, $X_2$, $R'_1$-$R'_{13}$, $Ar_1$-$Ar_4$, $L_0$, $L_1$, Z, $r_1$-$r_4$, and $R_{O1}$-$R_{O4}$.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
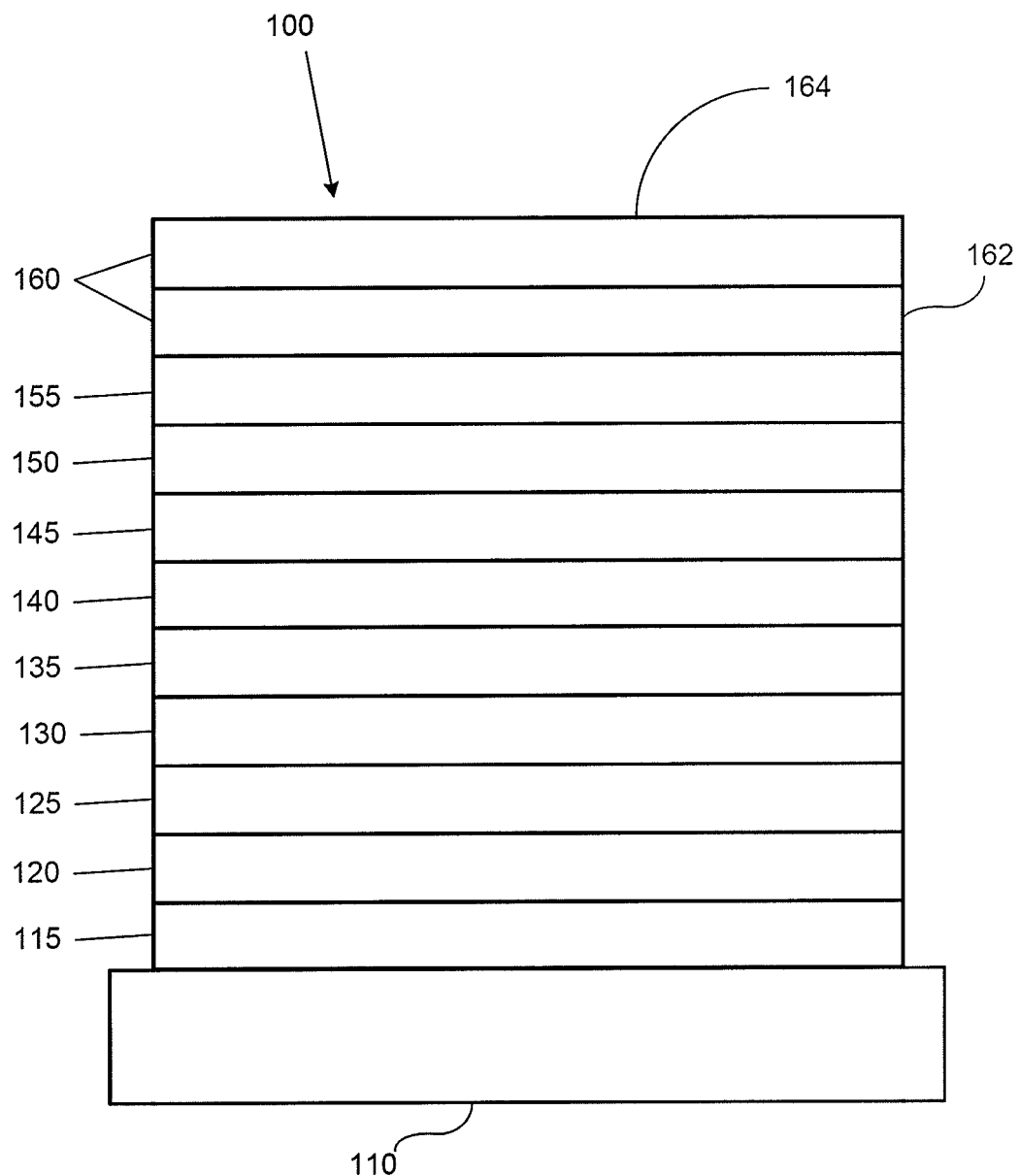
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
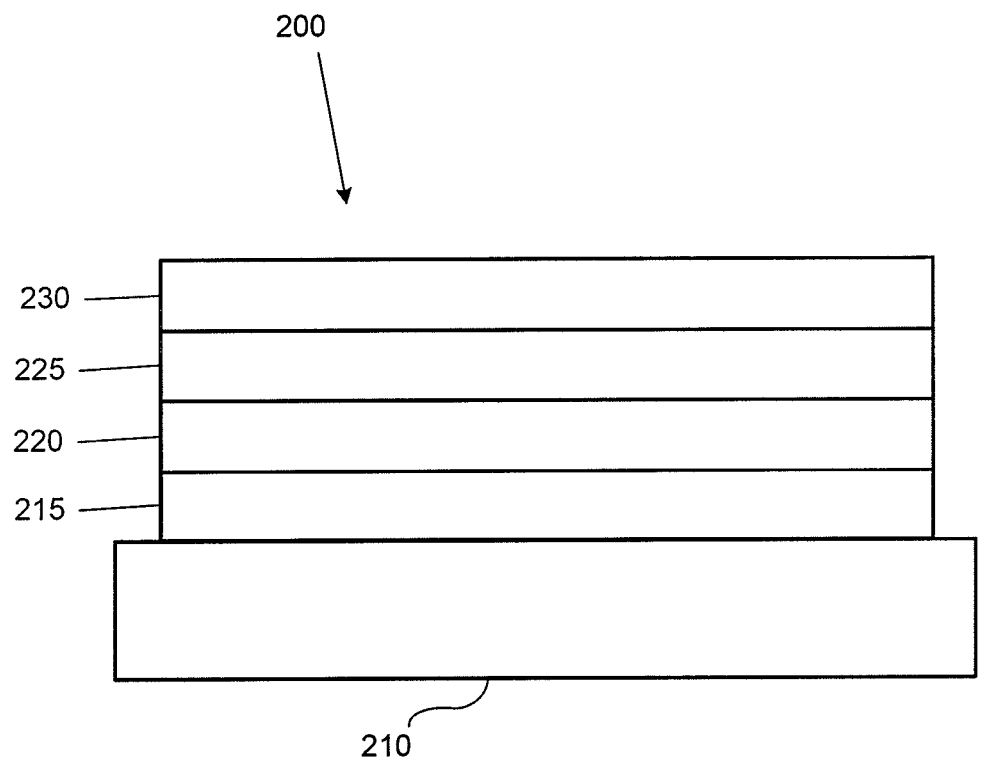
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

A method of fabricating an organic light emitting device by solution depositing an organic layer comprising an organic electron donor and an organic electron acceptor, which forms a layer insoluble to a non-polar solvent, is provided. Preferably, the organic layer forms a hole injection layer (HIL) in the device. The HIL is a particularly important organic layer in an OLED, because it helps provide holes to the emissive material in the emissive layer.

For solution processed OLEDs, an organic layer must be resistant to the solvent used in the next organic layer. Previously, there were only two methods available to provide an organic layer resistant to subsequent layers. First, an orthogonal solvent may be used, such as PEDOT/PSS in aqueous solution. Second, cross-linkable polymers may be used. In the second instance, the film becomes insoluble after the layer is treated to crosslink the polymers. (See, e.g., WO2008073440).

Here, a mixture of non-cross-linkable organic compounds forms a layer insoluble to a non-polar solvent used in a subsequent organic layer. As used herein, a "non-polar solvent"

has a polarity index equal to or less than 3.5. The polarity index is defined in the Solvent Miscibility Table in the Appendix of the Phenomenex catalog (also see, http://www.chemical-ecology.net/java/solvents.htm). The insoluble organic layer includes an organic electron donor, e.g., a triarylamine derivative, and an organic electron acceptor, e.g., azatriphenylene. Especially preferred organic electron donors have an oxidation potential less than 0.6 V vs Fc+/Fc. Organic electron acceptors have a first reduction potential high than −1.0 V vs Fc+/Fc. Without being bound by theory, it is believed that the organic electron donor and the organic electron acceptor form an ionic charge transfer complex, thereby creating a layer insoluble to a non-polar solvent.

Vacuum thermal evaporation OLEDs containing triarylamine derivatives have been reported in the literature. (See, e.g., US2008107919A1, US2008124572A1, and U.S. Pat. No. 6,344,283B1). In particular, the use of p-doped triarylamine derivatives as HIL materials for vacuum thermal evaporation OLEDs has been reported. (See Walzer et al., Chemical Review, 2007, 107, 1233). Solution-processed OLEDs comprising an insoluble layer of triarylamine in combination with an inorganic electron donor, where the layer is embedded in metal oxide, have also been reported. (See Suzuki et al., SID Digest, 2007, 1840-1843). However, an organic layer containing a non-cross-linkable triarylamine derivative in combination with an organic electron acceptor has not been reported. The formation of a good organic layer film using these compounds was unexpected for several reasons. The properties of the compounds suggest that they would make poor films for a solution processed multilayer device. In particular, the crystallinity of triarylamine derivatives and the azatriphenylene suggests poor film formation. Further, these compounds have been traditionally used in OLEDs in which layers were deposited using VTE processing, a method very different from solution-processing.

Moreover, formation of an insoluble layer upon heating the triarylamine derivative and conductivity dopant composition was surprising. It would be expected that the film would have very poor solvent resistance, thus unsuitable for use in a solution processed multilayer device. If heated separately, the compounds would not become insoluble. Here, heating the organic layer comprising the organic electron donor, i.e., triarylamine derivative, and the organic electron acceptor, i.e., azatriphenylene, unexpectedly resulted in formation of a layer insoluble to a non-polar solvent. There are no prior reports of an insoluble organic layer comprising small molecule compounds that do not require cross-linking. Thus, there was no expectation that these small molecule materials would become insoluble when heated. The insoluble layer described herein is especially beneficial for fabrication of solution processed OLEDs.

Figure 3:
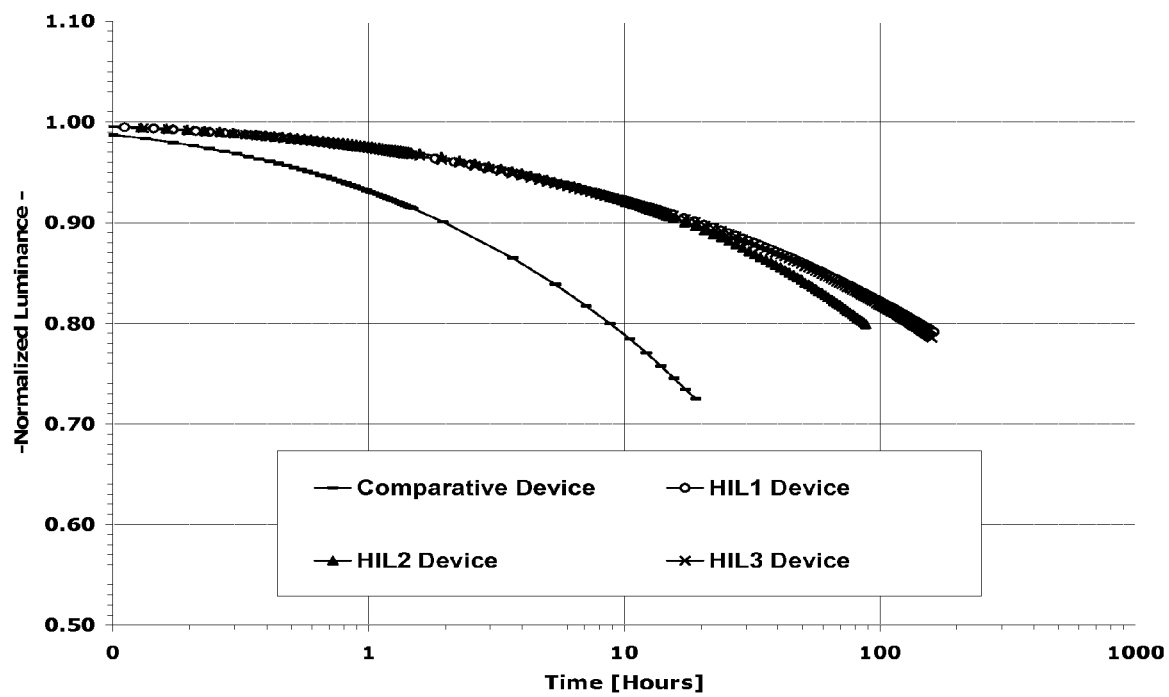
FIG. 3 shows a plot of device lifetimes.

Further, devices comprising an organic layer containing the organic electron donor, i.e., triarylamine derivative, and the organic electron acceptor, i.e., azatriphenylene, may have improved properties, including longer lifetime, good reproducibility, lower operating voltage while maintaining luminous efficiency, and improved purification, as illustrated in FIG. 3.

A method of fabricating an organic light emitting device is provided. The method comprises providing an electrode, depositing a first organic layer in contact with the electrode by a solution process, and heating the first organic layer to form a layer that is insoluble in a non-polar solvent. Preferably, the electrode is an anode, and the first organic layer is deposited in contact with the anode.

The first organic layer comprises an organic electron acceptor and an organic electron donor having the formula:

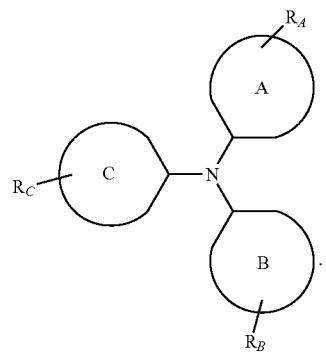

A, B, and C are 5 or 6 membered cyclic or heterocyclic rings. $R_A$, $R_B$, and $R_C$ are independent selected from the group consisting of hydrogen, halogen, alkyl, alkoxy, amino, alkenyl, alkynyl, aryl and heteroaryl. $R_A$, $R_B$, and $R_C$ are optionally fused to A, B, and C. At least two of $R_A$, $R_B$, and $R_C$ contain the structure:

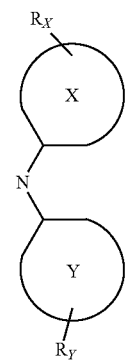

X and Y are independently 5 or 6 membered cyclic or heterocyclic rings. $R_X$ and $R_Y$ are independently selected from the group consisting of hydrogen, halogen, alkyl, alkoxy, amino, alkenyl, alkynyl, aryl and heteroaryl. $R_X$ and $R_Y$ are optionally fused to X and Y. $R_X$ and $R_Y$ are optionally connected to A and B.

In one aspect, the organic electron donor has the formula:

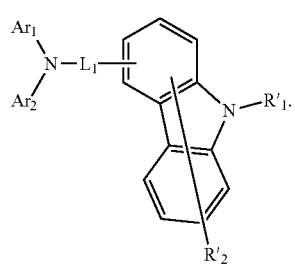

$L_1$ represents a substituted or unsubstituted arylene group having 6 to 60 carbon atoms forming the aromatic ring, a substituted or unsubstituted fluorenylene group, or a substituted or unsubstituted heteroarylene group having 5 to 60 atoms forming a ring; $Ar_1$ and $Ar_2$ each independently represents a substituted or unsubstituted aryl group having 6 to 60 carbon atoms forming the aromatic ring or a substituted or unsubstituted heteroaryl group having 5 to 60 atoms forming a ring; $R'_1$ represents a substituted or unsubstituted aryl group having 6 to 60 carbon atoms forming the aromatic ring; $R'Z_2$ represents a hydrogen atom, a substituted or unsubstituted aryl group having 6 to 60 carbon atoms forming the aromatic ring, a substituted or unsubstituted alkyl group having 1 to 50 carbon atoms, a substituted or unsubstituted alkoxy group having 1 to 50 carbon atoms, a substituted or unsubstituted aryloxy group having 6 to 50 atoms forming a ring, a substituted or unsubstituted arylthio group having 5 to 50 atoms forming a ring, a substituted or unsubstituted alkoxycarbonyl group having 2 to 50 carbon atoms, an amino group substituted by a substituted or unsubstituted aryl group having 6 to 50 carbon atoms forming the aromatic ring, a halogen atom, a cyano group, a nitro group, a hydroxyl group or a carboxyl group; with the proviso that neither $Ar_1$ nor $Ar_2$ contains a fluorene structure, and that the number of a carbazole structures in the aromatic amine derivative represented by the formula is 1 or 2.

In another aspect, the organic electron donor has the formula:

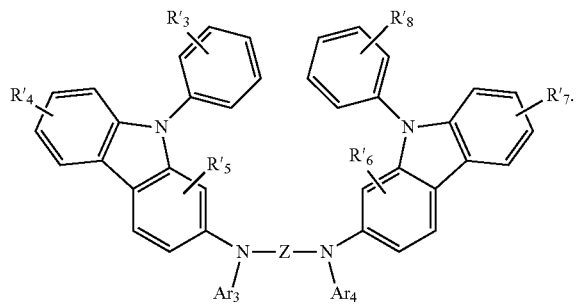

Z is selected from the group consisting of a substituted or unsubstituted C1-C30 alkylene group, a substituted or unsubstituted C2-C30 alkenylene group, a substituted or unsubstituted C6-C30 arylene group, a substituted or unsubstituted C2-C30 heteroarylene group, and a substituted or unsubstituted C2-C30 heterocyclic group; each of $R'_3$, $R'_4$, $R'_5$, $R'_6$, $R'_7$, and $R'_8$ is independently selected from the group consisting of a hydrogen atom, a substituted or unsubstituted C1-C30 alkyl group, a substituted or unsubstituted C1-C30 alkoxy group, a substituted or unsubstituted C6-C30 aryl group, a substituted or unsubstituted C6-C30 aryloxy group, a substituted or unsubstituted C2-C30 heterocyclic group, a substituted or unsubstituted C6-C30 condensed polycyclic group, a hydroxy group, a cyano group, and a substituted or unsubstituted amino group, and, alternatively, two or more adjacent groups among $R'_3$, $R'_4$, $R'_5$, $R'_6$, $R'_7$, and $R'_8$ can be connected to each other to form a saturated or unsaturated carbocycle; and wherein each of $Ar_3$ and $Ar_4$ are independently a substituted or unsubstituted C6-C30 aryl group or a substituted or unsubstituted C2-C30 heteroaryl group.

In yet another aspect, the organic electron donor has the formula:

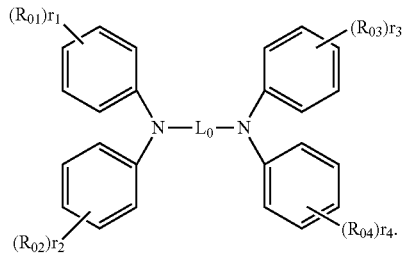

$L_0$ is any one of o-, p-, and m-phenylene groups which have two, three or four rings and which have a substituent with the proviso that when $L_0$ is a phenylene group having four rings, the phenylene group may have an unsubstituted or substituted aminophenyl group somewhere therein, and $R_{01}$, $R_{02}$, $R_{03}$ and $R_{04}$ are any one of the following groups:

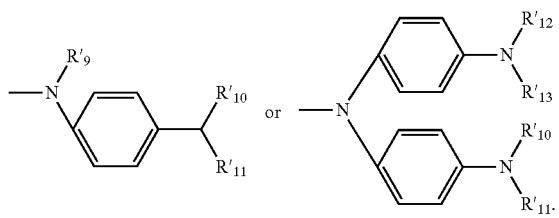

$R'_9$, $R'_{10}$, $R'_{11}$, $R'_{12}$ and $R'_{13}$ are each a substituted or unsubstituted aryl group, and $r_1$, $r_2$, $r_3$ and $r_4$ are each an integer of 0 to 5 with the proviso that $r_1+r_2+r_3+r_4 \geq 1$.

In one aspect, the organic electron acceptor is selected from the group consisting of:

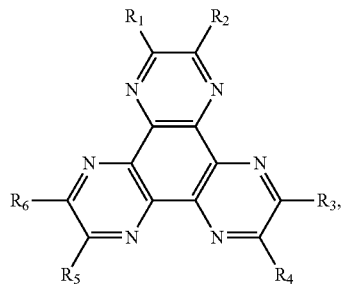

$R_1$, $R_2$, $R_3$, $R_4$, $R_5$, and $R_6$ are independently chosen from the group consisting of hydrogen, halogen, nitrile, nitro, sulfonyl, solfoxide, sulfonamide, sulfonate, trifluoromethyl, ester, amide, straight-chain or branched C1-C12 alkoxy, straight-chain or branched C1-C12 alkyl, aromatic or non-aromatic (substituted or unsubstituted) heterocyclic, substituted or unsubstituted aryl, mono- or di-(substituted or unsibstituted)aryl-amine, and (substituted or unsubstituted)alkyl-(substituted or unsubstituted)aryl-amine; or where $R_1$ and $R_2$, $R_3$ and $R_4$, and $R_5$ and $R_6$ combine form a ring structure including an aromatic ring, a heteroaromatic ring, or a non-aromatic ring, and each ring is substituted or unsubstituted;

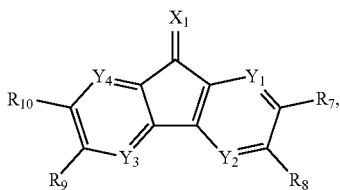

$Y_1$ to $Y_4$ are independently a carbon atom or a nitrogen atom. $R_7$ to $R_{10}$ are independently a hydrogen atom, an alkyl group, a substituted or unsubstituted aryl group, a substituted or unsubstituted heterocycle, a halogen atom, a fluoroalkyl group or a cyano group. $R_7$ and $R_8$, and $R_9$ and $R_{10}$ are independently bonded to form a substituted or unsubstituted aromatic ring or a substituted or unsubstituted heterocycle. $X_1$ is selected from the group consisting of:

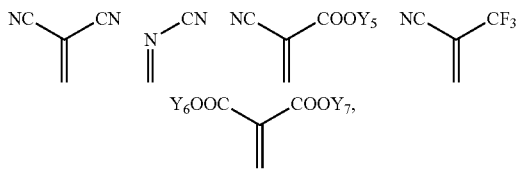

$Y_5$ to $Y_7$ are independently a hydrogen atom, a fluoroalkyl group, an alkyl group, an aryl group or a heterocyclic group; and $Y_6$ and $Y_7$ may form a ring;

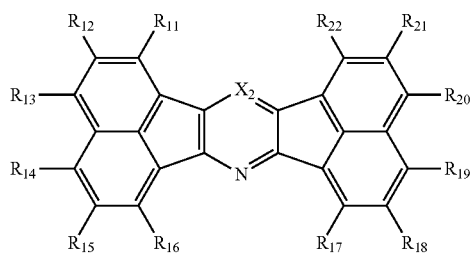

$X_2$ is

$C(R_{23})$ or N, $R_{11}$ to $R_{23}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 40 carbon atoms, a trialkylsilyl group wherein the alkyl group has 1 to 20 carbon atoms and may have a substituent, an aryloxy group wherein the aryl group has 6 to 40 carbon atoms and may have a substituent, a halogen atom, or a cyano group, provided that at least two of $R_{11}$ to $R_{23}$ each represent a cyano group, a trifluoromethyl group or a fluorine atom and that those of $R_{11}$ to $R_{23}$, which are adjacent to one another, may be linked together to form a ring structure;

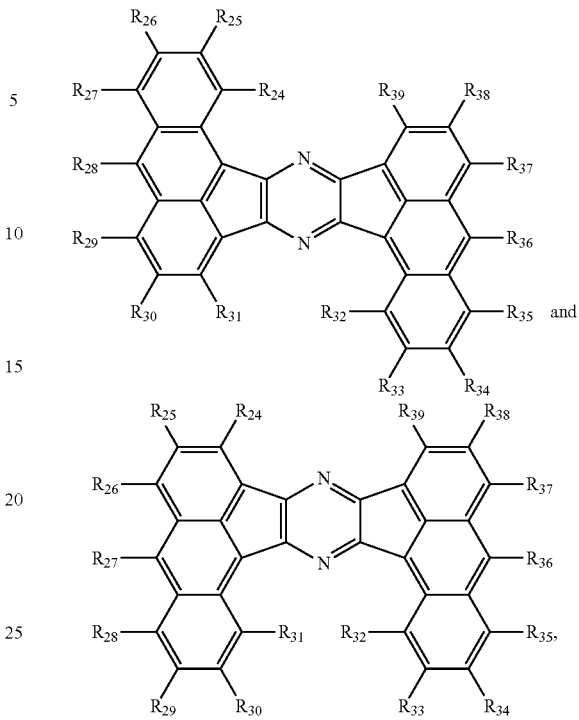

$R_{24}$ to $R_{39}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 40 carbon atoms, a trialkylsilyl group wherein the alkyl group has 1 to 20 carbon atoms and may have a substituent, an aryloxy group wherein the aryl group has 6 to 40 carbon atoms and may have a substituent, a halogen atom, or a cyano group, provided that at least two of $R_{24}$ to $R_{39}$ each represent a cyano group, a trifluoromethyl group or a fluorine atom and that those of $R_{24}$ to $R_{39}$ which are adjacent to one another, may be linked together to form a ring structure;

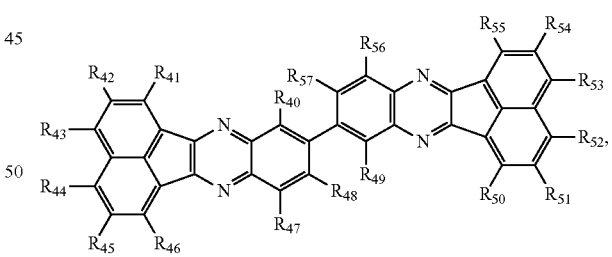

$R_{40}$ to $R_{57}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 40 carbon atoms, a trialkylsilyl group wherein the alkyl group has 1 to 20 carbon atoms and may have a substituent, an aryloxy group wherein the aryl group has 6 to 40 carbon atoms and may have a substituent, a halogen atom, or a cyano group, provided that at least two of $R_{40}$ to $R_{57}$ each represent a cyano group, a trifluoromethyl group or a fluorine atom and that those of $R_{40}$ to $R_{57}$ which are adjacent to one another, may be linked together to form a ring structure; and

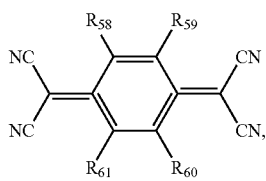

$R_{58}$-$R^{61}$ independently represents hydrogen, fluorine, or substituents independently selected from nitrile (—CN), nitro (—NO$_2$), sulfonyl (—SO$_2$R), sulfoxide (—SOR), trifluoromethyl (—CF$_3$), ester (—CO-DR), amide (—CONHR or —CO—NRR'), substituted or unsubstituted aryl, substituted or unsubstituted heteroaryl, or substituted or unsubstituted alkyl, where R and R' include substituted or unsubstituted alkyl or aryl; or $R_{58}$ and $R_{59}$, or $R_{60}$ and $R_{61}$, combine form a ring structure including an aromatic ring, a heteroaromatic ring, or a non-aromatic ring, and each ring is substituted or unsubstituted.

Preferably, the organic electron acceptor is:

Dopant 1

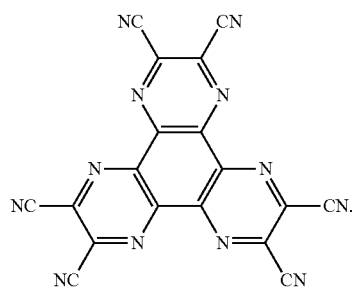

Preferably, the organic electron donor is selected from the group consisting of:

Compound 1

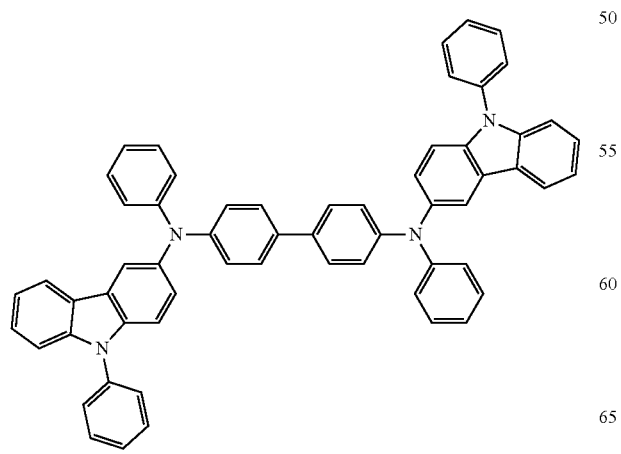

Compound 2

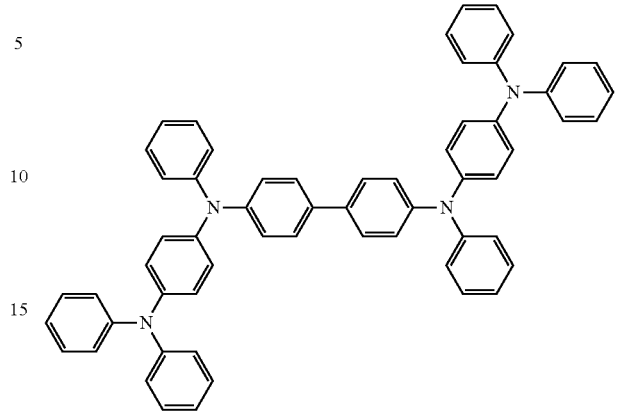

Compound 3

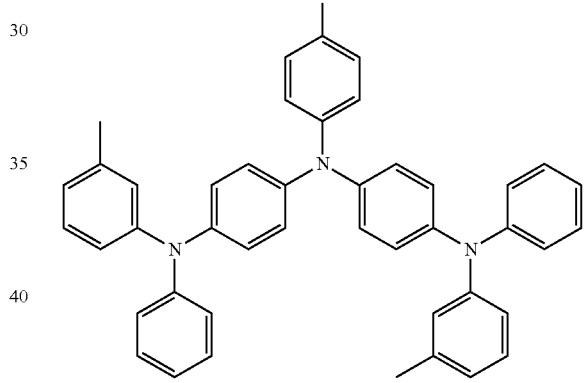

More preferably, the organic electron acceptor is:

Dopant 1

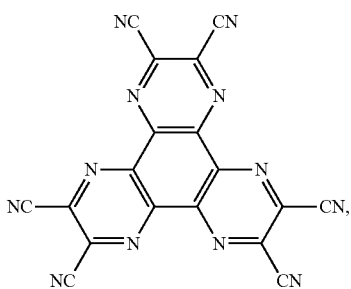

and
the organic electron donor is selected from the group consisting of:

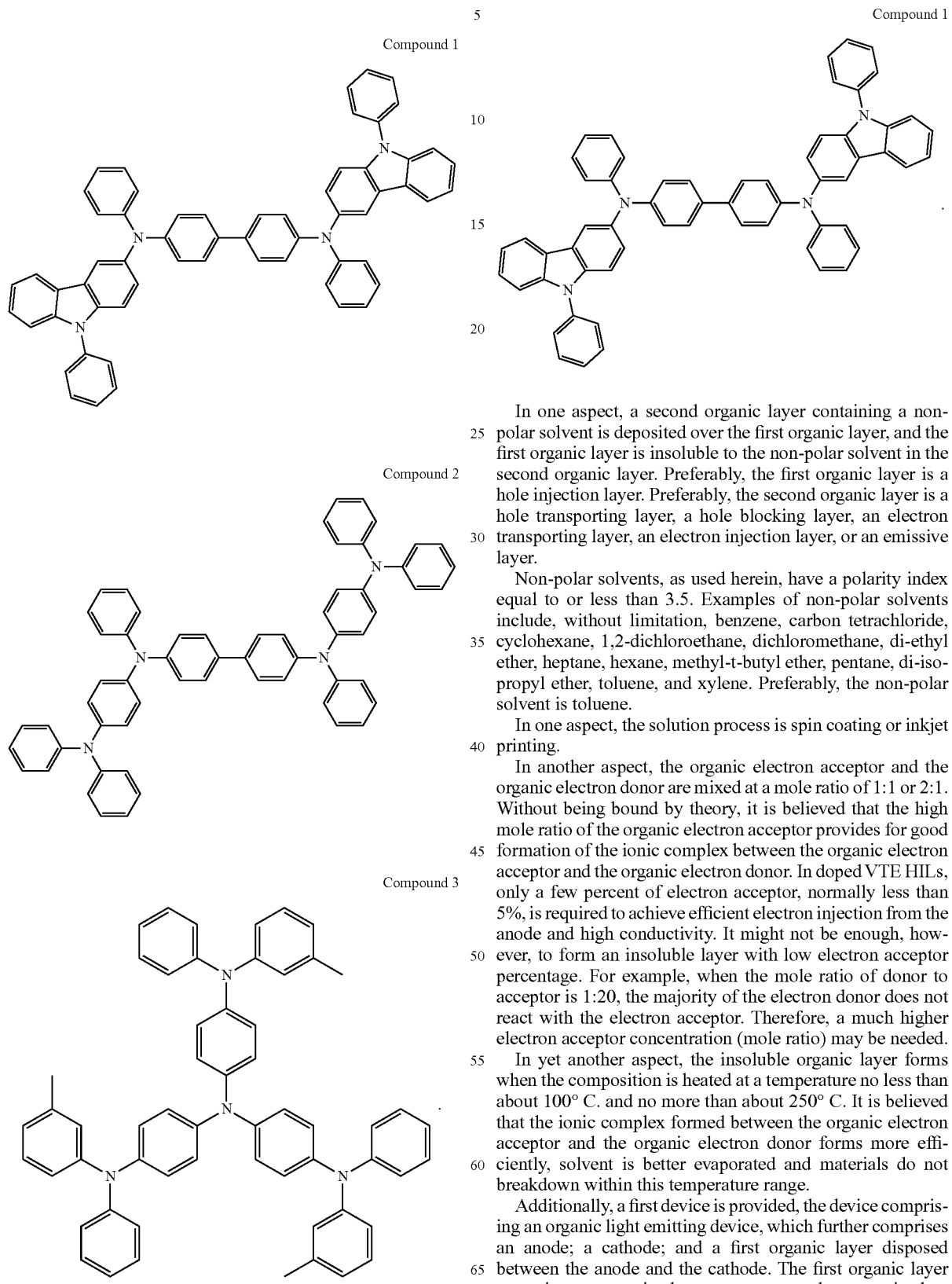

Compound 1

Compound 2

Compound 3

Most preferably, the organic electron acceptor is Dopant 1 and the organic electron donor is:

Compound 1

In one aspect, a second organic layer containing a non-polar solvent is deposited over the first organic layer, and the first organic layer is insoluble to the non-polar solvent in the second organic layer. Preferably, the first organic layer is a hole injection layer. Preferably, the second organic layer is a hole transporting layer, a hole blocking layer, an electron transporting layer, an electron injection layer, or an emissive layer.

Non-polar solvents, as used herein, have a polarity index equal to or less than 3.5. Examples of non-polar solvents include, without limitation, benzene, carbon tetrachloride, cyclohexane, 1,2-dichloroethane, dichloromethane, di-ethyl ether, heptane, hexane, methyl-t-butyl ether, pentane, di-isopropyl ether, toluene, and xylene. Preferably, the non-polar solvent is toluene.

In one aspect, the solution process is spin coating or inkjet printing.

In another aspect, the organic electron acceptor and the organic electron donor are mixed at a mole ratio of 1:1 or 2:1. Without being bound by theory, it is believed that the high mole ratio of the organic electron acceptor provides for good formation of the ionic complex between the organic electron acceptor and the organic electron donor. In doped VTE HILs, only a few percent of electron acceptor, normally less than 5%, is required to achieve efficient electron injection from the anode and high conductivity. It might not be enough, however, to form an insoluble layer with low electron acceptor percentage. For example, when the mole ratio of donor to acceptor is 1:20, the majority of the electron donor does not react with the electron acceptor. Therefore, a much higher electron acceptor concentration (mole ratio) may be needed.

In yet another aspect, the insoluble organic layer forms when the composition is heated at a temperature no less than about 100° C. and no more than about 250° C. It is believed that the ionic complex formed between the organic electron acceptor and the organic electron donor forms more efficiently, solvent is better evaporated and materials do not breakdown within this temperature range.

Additionally, a first device is provided, the device comprising an organic light emitting device, which further comprises an anode; a cathode; and a first organic layer disposed between the anode and the cathode. The first organic layer comprises an organic electron acceptor and an organic electron donor having the formula:

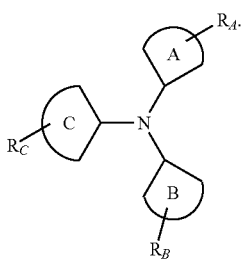

A, B, and C are 5 or 6 membered cyclic or heterocyclic rings. $R_A$, $R_B$, and $R_C$ are independently selected from the group consisting of hydrogen, halogen, alkyl, alkoxy, amino, alkenyl, alkynyl, aryl and heteroaryl. $R_A$, $R_B$, and $R_C$ are optionally fused to A, B, and C. At least two of $R_A$, $R_B$, and $R_C$ contain the structure:

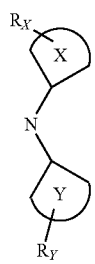

X and Y are independently 5 or 6 membered cyclic or heterocyclic rings. $R_X$ and Ry are independent selected from the group consisting of hydrogen, halogen, alkyl, alkoxy, amino, alkenyl, alkynyl, aryl and heteroaryl. $R_X$ and $R_Y$ are optionally fused to X and Y. $R_X$ and $R_Y$ are optionally connected to A and B. When the organic electron acceptor and the organic electron donor are heated, they form a layer that is insoluble in a non-polar solvent.

In one aspect, the first organic layer is deposited in contact with the anode.

In one aspect, the organic electron donor has the formula:

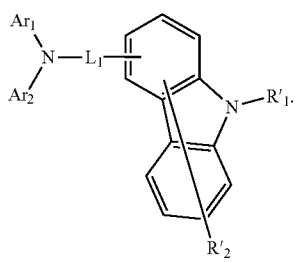

$L_1$ represents a substituted or unsubstituted arylene group having 6 to 60 carbon atoms forming the aromatic ring, a substituted or unsubstituted fluorenylene group, or a substituted or unsubstituted heteroarylene group having 5 to 60 atoms forming a ring; $Ar_1$ and $Ar_2$ each independently represents a substituted or unsubstituted aryl group having 6 to 60 carbon atoms forming the aromatic ring or a substituted or unsubstituted heteroaryl group having 5 to 60 atoms forming a ring; $R'_1$ represents a substituted or unsubstituted aryl group having 6 to 60 carbon atoms forming the aromatic ring; $R'_2$ represents a hydrogen atom, a substituted or unsubstituted aryl group having 6 to 60 carbon atoms forming the aromatic ring, a substituted or unsubstituted alkyl group having 1 to 50 carbon atoms, a substituted or unsubstituted alkoxy group having 1 to 50 carbon atoms, a substituted or unsubstituted aryloxy group having 6 to 50 atoms forming a ring, a substituted or unsubstituted arylthio group having 5 to 50 atoms forming a ring, a substituted or unsubstituted alkoxycarbonyl group having 2 to 50 carbon atoms, an amino group substituted by a substituted or unsubstituted aryl group having 6 to 50 carbon atoms forming the aromatic ring, a halogen atom, a cyano group, a nitro group, a hydroxyl group or a carboxyl group; with the proviso that neither $Ar_1$ nor $Ar_2$ contains a fluorene structure, and that the number of a carbazole structures in the aromatic amine derivative represented by the formula is 1 or 2.

In another aspect, the organic electron donor has the formula:

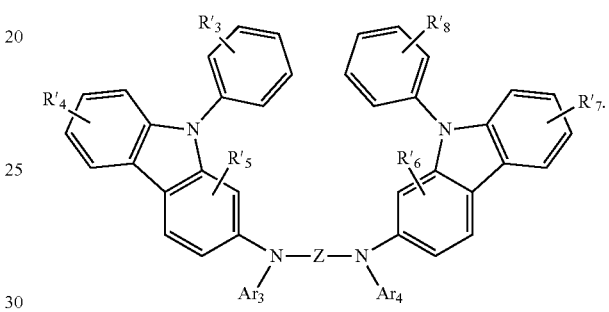

Z is selected from the group consisting of a substituted or unsubstituted C1-C30 alkylene group, a substituted or unsubstituted C2-C30 alkenylene group, a substituted or unsubstituted C6-C30 arylene group, a substituted or unsubstituted C2-C30 heteroarylene group, and a substituted or unsubstituted C2-C30 heterocyclic group; each of $R'_3$, $R'_4$, $R'_5$, $R'_6$, $R'_7$, and $R'_8$ is independently selected from the group consisting of a hydrogen atom, a substituted or unsubstituted C1-C30 alkyl group, a substituted or unsubstituted C1-C30 alkoxy group, a substituted or unsubstituted C6-C30 aryl group, a substituted or unsubstituted C6-C30 aryloxy group, a substituted or unsubstituted C2-C30 heterocyclic group, a substituted or unsubstituted C6-C30 condensed polycyclic group, a hydroxy group, a cyano group, and a substituted or unsubstituted amino group, and, alternatively, two or more adjacent groups among $R'_3$, $R'_4$, $R'_5$, $R'_6$, $R'_7$, and $R'_8$ can be connected to each other to form a saturated or unsaturated carbocycle; and wherein each of $Ar_3$ and $Ar_4$ are independently a substituted or unsubstituted C6-C30 aryl group or a substituted or unsubstituted C2-C30 heteroaryl group.

In yet another aspect, the organic electron donor has the formula:

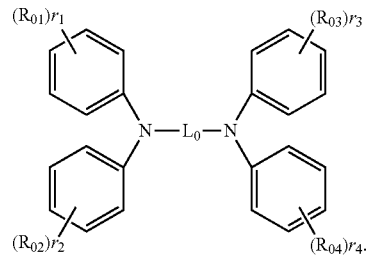

$L_0$ is any one of o-, p-, and m-phenylene groups which have two, three or four rings and which have a substituent with the proviso that when $L_0$ is a phenylene group having four rings, the phenylene group may have an unsubstituted or substituted aminophenyl group somewhere therein, and $R_{01}$, $R_{02}$, $R_{03}$ and $R_{04}$ are any one of the following groups:

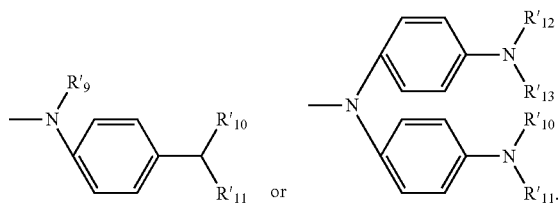

$R'_9$, $R'_{10}$, $R'_{11}$, $R'_{12}$ and $R'_{13}$ are each a substituted or unsubstituted aryl group, and $r_1$, $r_2$, $r_3$ and $r_4$ are each an integer of 0 to 5 with the proviso that $r_1+r_2+r_3+r_4 \geq 1$.

In one aspect, the organic electron acceptor is selected from the group consisting of:

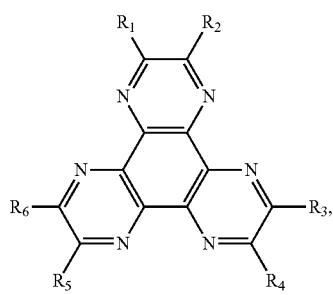

$R_1$, $R_2$, $R_3$, $R_4$, $R_5$, and $R_6$ are independently chosen from the group consisting of hydrogen, halogen, nitrile, nitro, sulfonyl, solfoxide, sulfonamide, sulfonate, trifluoromethyl, ester, amide, straight-chain or branched C1-C12 alkoxy, straight-chain or branched C1-C12 alkyl, aromatic or nonaromatic (substituted or unsubstituted) heterocyclic, substituted or unsubstituted aryl, mono- or di-(substituted or unsubstituted)aryl-amine, and (substituted or unsubstituted)alkyl-(substituted or unsubstituted)aryl-amine; or where $R_1$ and $R_2$, $R_3$ and $R_4$, and $R_5$ and $R_6$ combine form a ring structure including an aromatic ring, a heteroaromatic ring, or a nonaromatic ring, and each ring is substituted or unsubstituted;

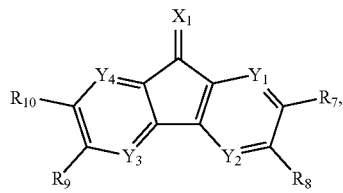

$Y_1$ to $Y_4$ are independently a carbon atom or a nitrogen atom. $R_7$ to $R_{10}$ are independently a hydrogen atom, an alkyl group, a substituted or unsubstituted aryl group, a substituted or unsubstituted heterocycle, a halogen atom, a fluoroalkyl group or a cyano group. $R_7$ and $R_8$, and $R_9$ and $R_{10}$ are independently bonded to form a substituted or unsubstituted aromatic ring or a substituted or unsubstituted heterocycle. $X_1$ is selected from the group consisting of:

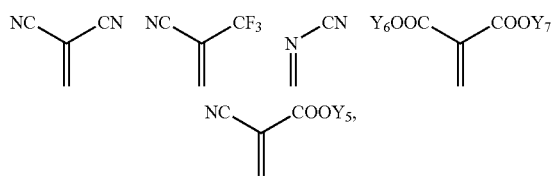

$Y_5$ to $Y_7$ are independently a hydrogen atom, a fluoroalkyl group, an alkyl group, an aryl group or a heterocyclic group; and $Y_6$ and $Y_7$ may form a ring;

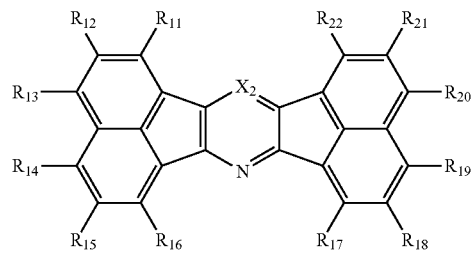

$X_2$ is

$C(R_{23})$ or N, $R_{11}$ to $R_{23}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 40 carbon atoms, a trialkylsilyl group wherein the alkyl group has 1 to 20 carbon atoms and may have a substituent, an aryloxy group wherein the aryl group has 6 to 40 carbon atoms and may have a substituent, a halogen atom, or a cyano group, provided that at least two of $R_{11}$ to $R_{23}$ each represent a cyano group, a trifluoromethyl group or a fluorine atom and that those of $R_{11}$ to $R_{23}$, which are adjacent to one another, may be linked together to form a ring structure;

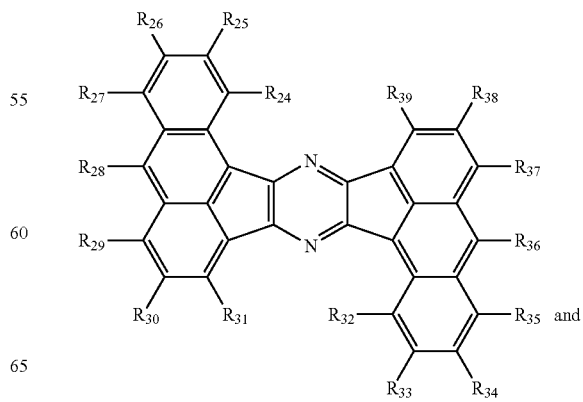

and

-continued

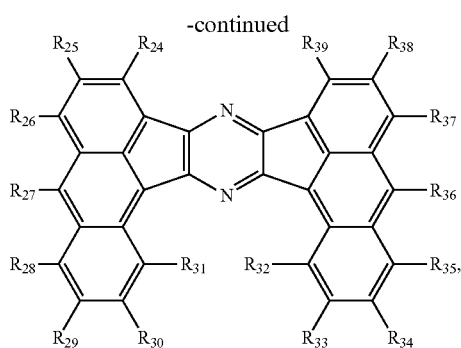

$R_{24}$ to $R_{39}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 40 carbon atoms, a trialkylsilyl group wherein the alkyl group has 1 to 20 carbon atoms and may have a substituent, an aryloxy group wherein the aryl group has 6 to 40 carbon atoms and may have a substituent, a halogen atom, or a cyano group, provided that at least two of $R_{24}$ to $R_{39}$ each represent a cyano group, a trifluoromethyl group or a fluorine atom and that those of $R_{24}$ to $R_{39}$ which are adjacent to one another, may be linked together to form a ring structure;

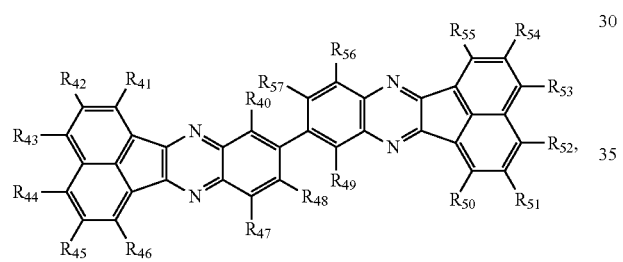

$R_{40}$ to $R_{57}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 40 carbon atoms, a trialkylsilyl group wherein the alkyl group has 1 to 20 carbon atoms and may have a substituent, an aryloxy group wherein the aryl group has 6 to 40 carbon atoms and may have a substituent, a halogen atom, or a cyano group, provided that at least two of $R_{40}$ to $R_{57}$ each represent a cyano group, a trifluoromethyl group or a fluorine atom and that those of $R_{40}$ to $R_{57}$ which are adjacent to one another, may be linked together to form a ring structure; and

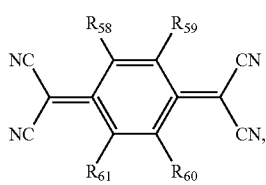

$R_{58}$-$R_{61}$ independently represents hydrogen, fluorine, or substituents independently selected from nitrile (—CN), nitro (—NO$_2$), sulfonyl (—SO$_2$R), sulfoxide (—SOR), trifluoromethyl (—CF$_3$), ester (—CO-DR), amide (—CONHR or —CO—NRR'), substituted or unsubstituted aryl, substituted or unsubstituted heteroaryl, or substituted or unsubstituted alkyl, where R and R' include substituted or unsubstituted alkyl or aryl; or $R_{58}$ and $R_{59}$, or $R_{60}$ and $R_{61}$, combine form a ring structure including an aromatic ring, a heteroaromatic ring, or a non-aromatic ring, and each ring is substituted or unsubstituted.

Preferably, the organic electron acceptor has the formula:

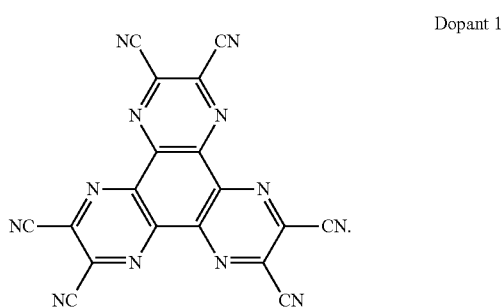 [SMILES: N#Cc1nc2c3nc(C#N)c(C#N)nc3c3nc(C#N)c(C#N)nc3c2nc1C#N]

Dopant 1

Preferably, the organic electron donor is selected from the group consisting of:

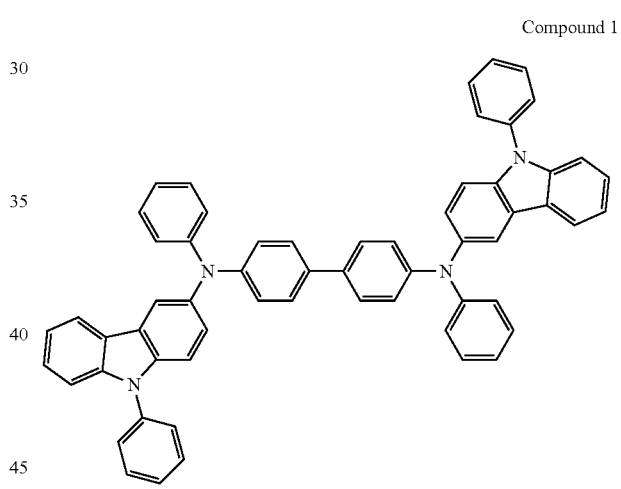

Compound 1

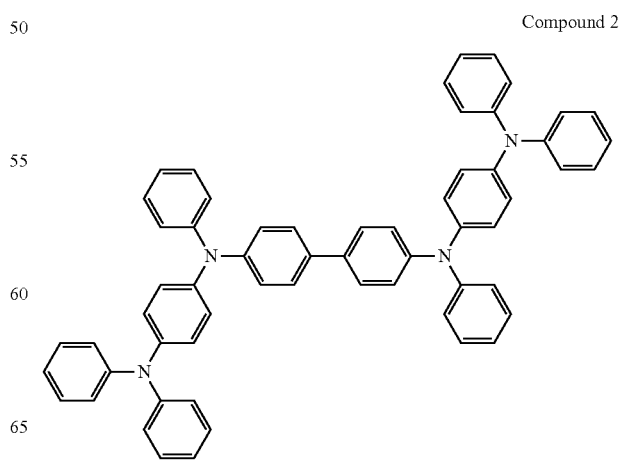

Compound 2

-continued

Compound 3

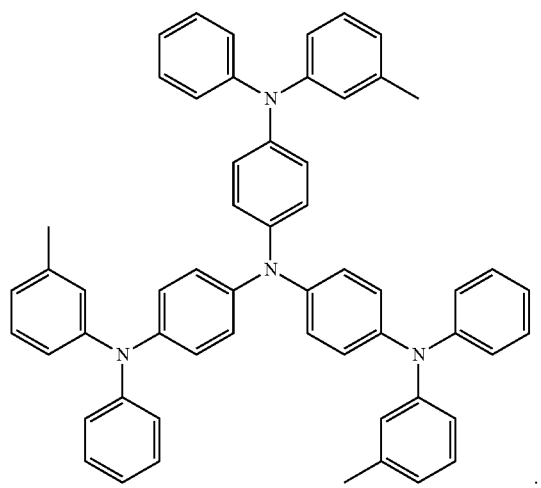

Compound 3

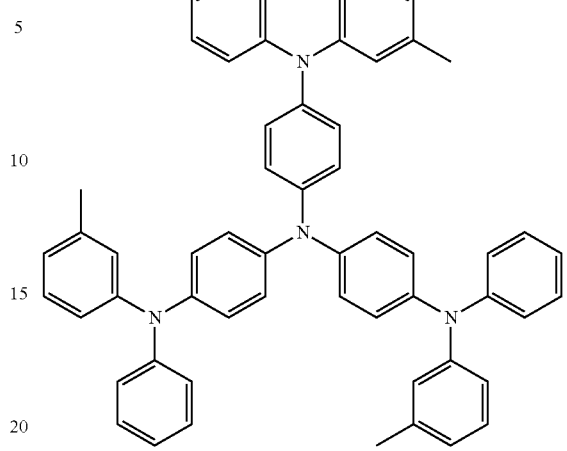

More preferably, the organic electron acceptor is Dopant 1 and the organic electron donor is selected from the group consisting of:

Most preferably, the organic electron donor has the formula:

Compound 1

Compound 1

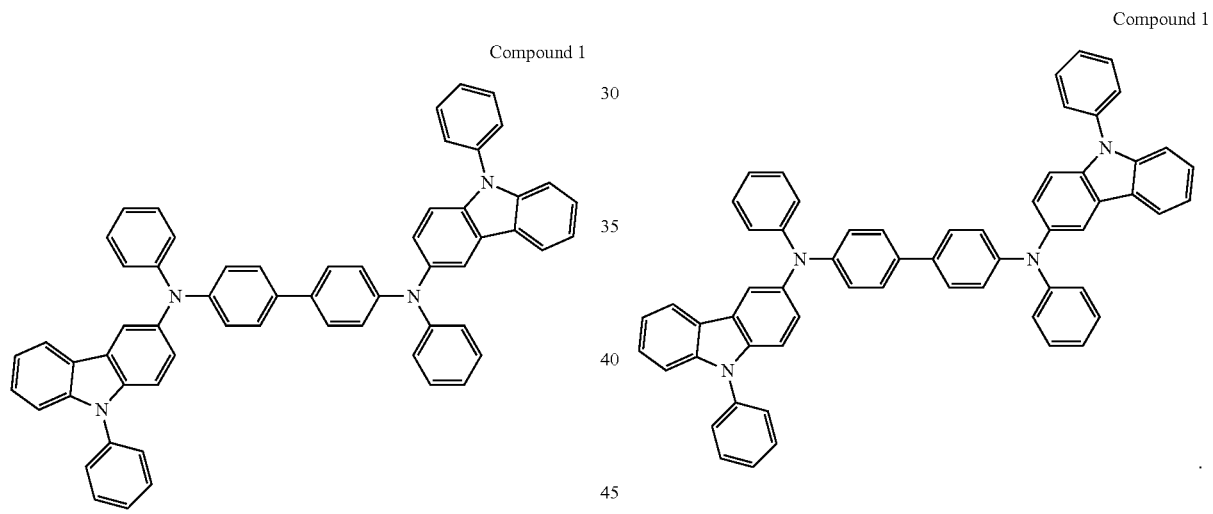

Compound 2

In one aspect, the organic electron acceptor and the organic electron donor form a layer that is insoluble in a non-polar solvent having a polarity index equal to or less than 3.5. Examples of non-polar solvents include, without limitation, benzene, carbon tetrachloride, cyclohexane, 1,2-dichloroethane, dichloromethane, di-ethyl ether, heptane, hexane, methyl-t-butyl ether, pentane, di-iso-propyl ether, toluene, and xylene. Preferably, the non-polar solvent is toluene.

In one aspect, the first device is a consumer product. In another aspect, the first device is an organic light emitting device.

In another aspect, the layer that is insoluble in a non-polar solvent forms when the organic electron acceptor and the organic electron donor are heated at a temperature no less than about 100° C. and no more than about 250° C. For reasons discussed above, it is believed that the ionic omplex between the organic electron acceptor and the organic electron donor forms more efficiently within this temperature range.

In one aspect, the organic electron acceptor and the organic electron donor are mixed at a mole ratio of 1:1 or 2:1.

In another aspect, a second organic layer containing a non-polar solvent is deposited over the first organic layer, and the first organic layer is insoluble to the non-polar solvent contained in the second organic layer. Preferably, the first organic layer is a hole injection layer. In yet a further aspect, the second organic layer is a hole transporting layer, a hole blocking layer, an electron transporting layer, an electron injection layer, or an emissive layer.

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 1 below. Table 1 lists non-limiting classes of materials, non-limiting examples of compounds for each class, and references that disclose the materials.

TABLE 1

| MATERIAL | EXAMPLES OF MATERIAL | PUBLICATIONS |
|---|---|---|
| Hole injection materials | | |
| Phthalocyanine and porphyrin compounds | 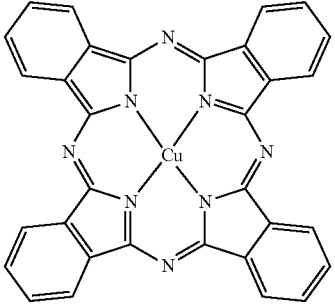 | Appl. Phys. Lett. 69, 2160 (1996) |
| Starburst triarylamines | 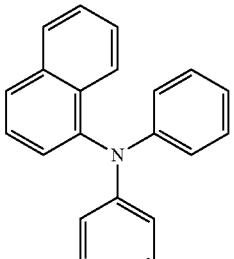 | J. Lumin. 72-74, 985 (1997) |
| CF$_x$ Fluorohydrocarbon polymer | 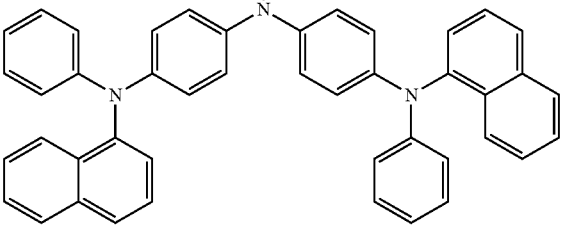 | Appl. Phys. Lett. 78, 673 (2001) |
| Conducting polymers (e.g., PEDOT:PSS, polyaniline, polythiophene) | 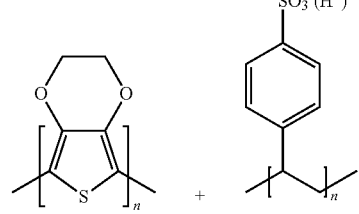 | Synth. Met. 87, 171 (1997) WO2007002683 |

TABLE 1-continued

| MATERIAL | EXAMPLES OF MATERIAL | PUBLICATIONS |
| --- | --- | --- |
| Phosphonic acid and silane SAMs | | US20030162053 |
| Triarylamine or polythiophene polymers with conductivity dopants | | EA01725079A1 |
| Arylamines complexed with metal oxides such as molybdenum and tungsten oxides | | SID Symposium Digest, 37, 923 (2006) WO2009018009 |

TABLE 1-continued
| MATERIAL | EXAMPLES OF MATERIAL | PUBLICATIONS |
|---|---|---|
| p-type semiconducting organic complexes | 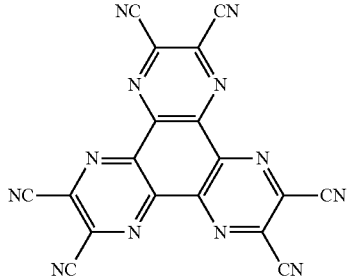 [SMILES: N#Cc1nc2c3nc(C#N)c(C#N)nc3c3nc(C#N)c(C#N)nc3c2nc1C#N] | US20020158242 |
| Metal organometallic complexes | 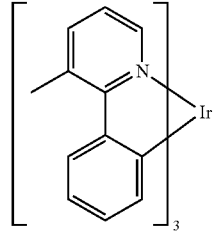 | US20060240279 |
| Cross-linkable compounds | 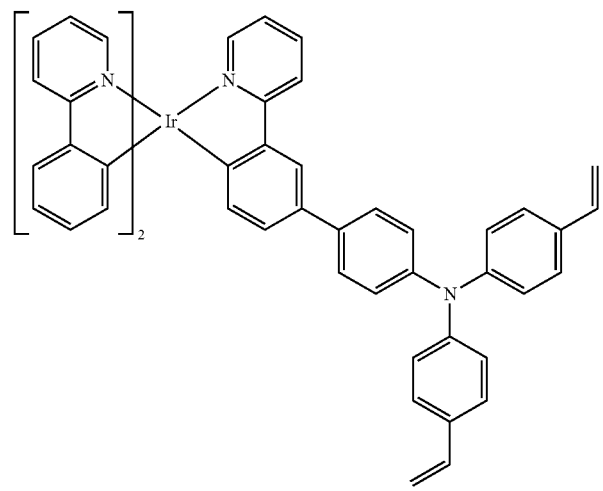 | US20080220265 |
| Hole transporting materials | | |
| Triarylamines (e.g., TPD, α-NPD) | 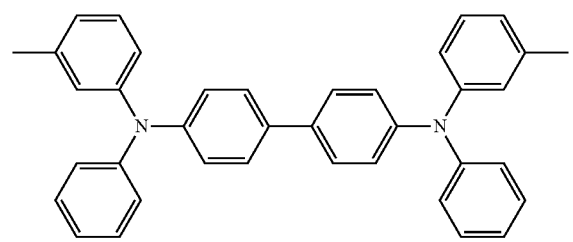 | Appl. Phys. Lett. 51, 913 (1987) |
| | 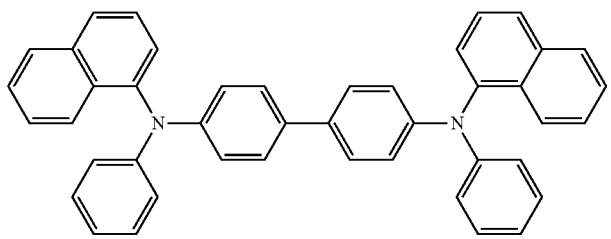 [SMILES: c1ccc(N(c2ccc(-c3ccc(N(c4ccccc4)c4cccc5ccccc45)cc3)cc2)c2cccc3ccccc23)cc1] | US5061569 |

TABLE 1-continued
| MATERIAL | EXAMPLES OF MATERIAL | PUBLICATIONS |
|---|---|---|
| | 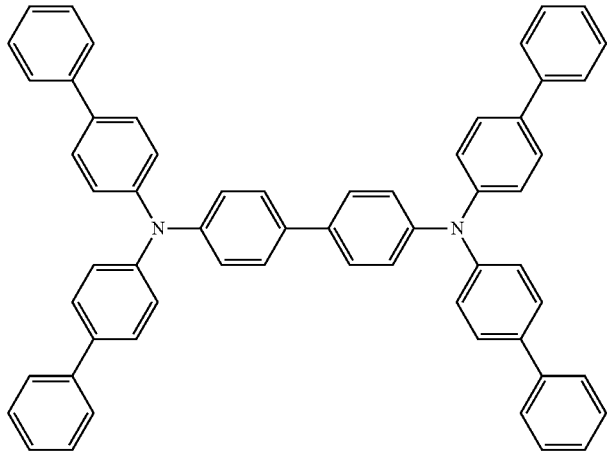 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |
| | 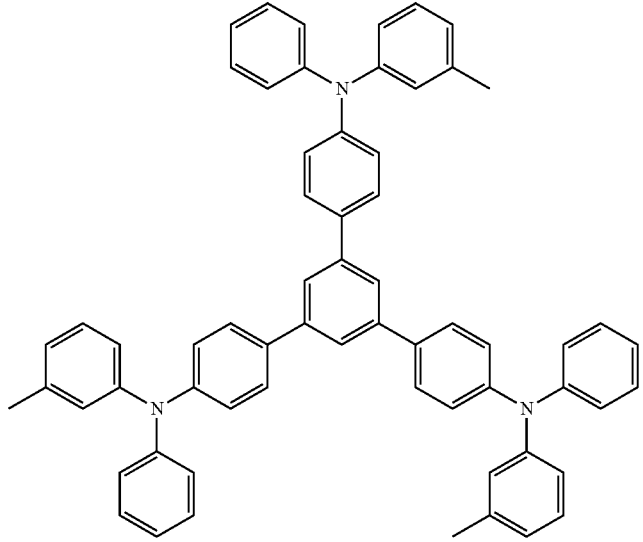 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |
| | 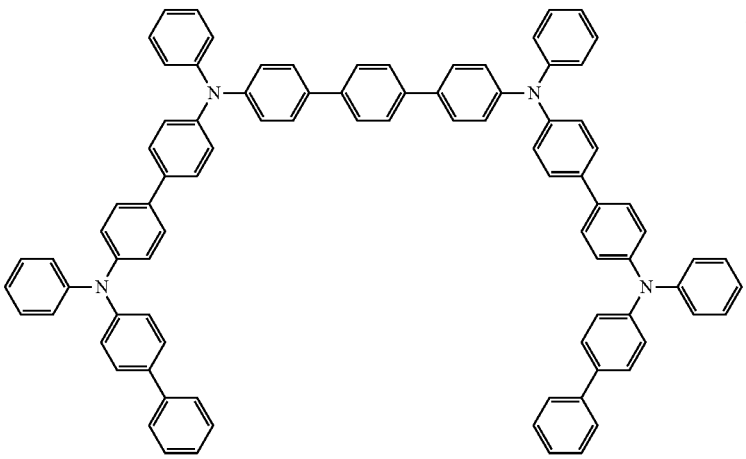 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |

TABLE 1-continued

| MATERIAL | EXAMPLES OF MATERIAL | PUBLICATIONS |
|---|---|---|
| | | Appl. Phys. Lett. 90, 183503 (2007) |
| Triarylamine on spirofluorene core | | Synth. Met. 91, 209 (1997) |
| Arylamine carbazole compounds | | Adv. Mater. 6, 677 (1994), US20080124572 |
| Triarylamine with (di)benzothiophene/(di)benzofuran | | US20070278938, US20080106190 |

TABLE 1-continued

| MATERIAL | EXAMPLES OF MATERIAL | PUBLICATIONS |
| --- | --- | --- |
| Indolocarbazoles | | Synth. Met. 111, 421 (2000) |
| Isoindole compounds | | Chem. Mater. 15, 3148 (2003) |
| Metal carbene complexes | | US20080018221 |

Phosphorescent OLED host materials
Red hosts

| | | |
| --- | --- | --- |
| Arylcarbazoles | | Appl. Phys. Lett. 78, 1622 (2001) |

TABLE 1-continued

| MATERIAL | EXAMPLES OF MATERIAL | PUBLICATIONS |
|---|---|---|
| Metal 8-hydroxyquinolates (e.g., Alq$_3$, BAlq) | | Nature 395, 151 (1998) |
| | | US20060202194 |
| | | WO2005014551 |
| | | WO2006072002 |
| Metal phenoxybenzothiazole compounds | | Appl. Phys. Lett. 90, 123509 (2007) |
| Conjugated oligomers and polymers (e.g., polyfluorene) | | Org. Electron. 1, 15 (2000) |
| Aromatic fused rings | | WO2009066779, WO2009066778, WO2009063833, US20090045731, US20090045730, WO2009008311, US20090008605, US20090009065 |

| MATERIAL | EXAMPLES OF MATERIAL | PUBLICATIONS |
|---|---|---|
| Zinc complexes | 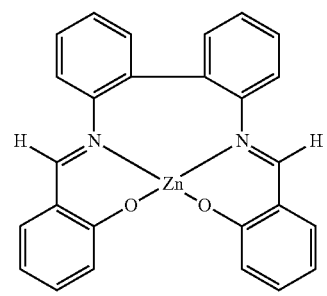 | WO2009062578 |
| Green hosts | | |
| Arylcarbazoles | 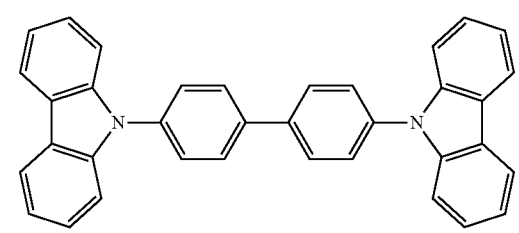 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| | 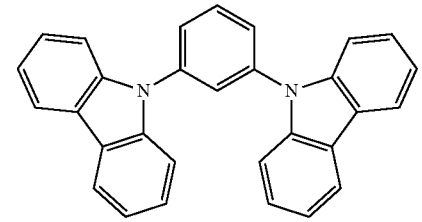 [SMILES: c1cc(-n2c3ccccc3c3ccccc32)cc(-n2c3ccccc3c3ccccc32)c1] | US20030175553 |
| | 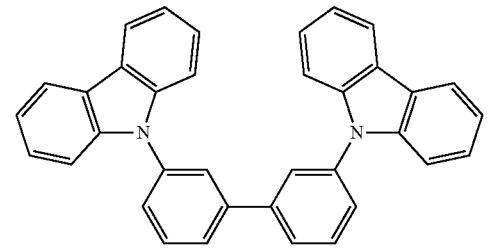 [SMILES: c1cc(-c2cccc(-n3c4ccccc4c4ccccc43)c2)cc(-n2c3ccccc3c3ccccc32)c1] | WO2001039234 |
| Aryltriphenylene compounds | 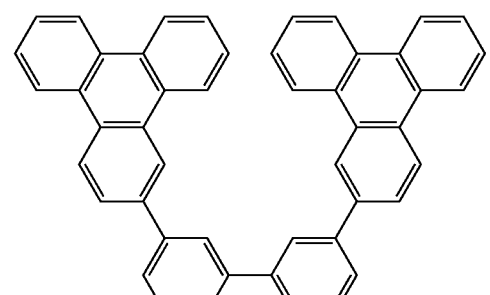 | US20060280965 |

TABLE 1-continued
| MATERIAL | EXAMPLES OF MATERIAL | PUBLICATIONS |
| --- | --- | --- |
| | 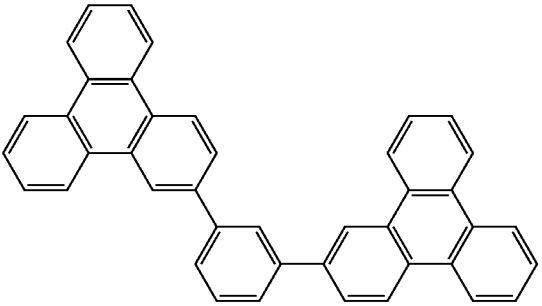 [SMILES: c1cc(-c2ccc3c4ccccc4c4ccccc4c3c2)cc(-c2ccc3c4ccccc4c4ccccc4c3c2)c1] | US20060280965 |
| | 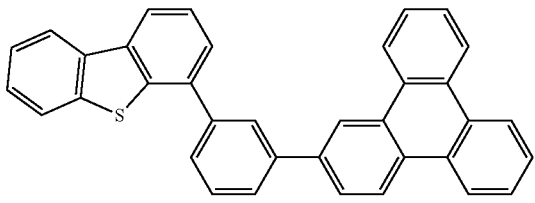 [SMILES: c1cc(-c2ccc3c4ccccc4c4ccccc4c3c2)cc(-c2cccc3c2sc2ccccc23)c1] | WO2009021126 |
| Donor acceptor type molecules | 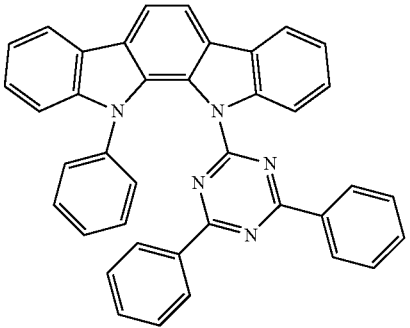 [SMILES: c1ccc(-c2nc(-c3ccccc3)nc(-n3c4ccccc4c4ccc5c6ccccc6n(-c6ccccc6)c5c43)n2)cc1] | WO2008056746 |
| Aza-carbazole/DBT/DBF | 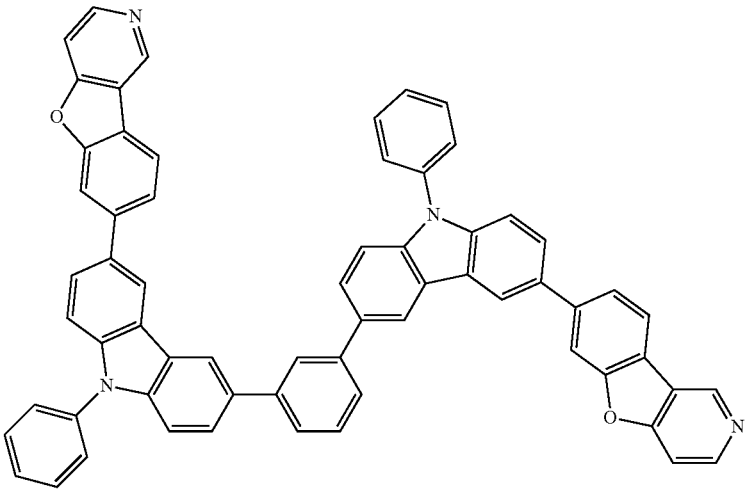 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |
| Polymers (e.g., PVK) | 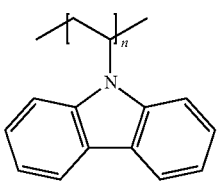 | Appl. Phys. Lett. 77, 2280 (2000) |

TABLE 1-continued

| MATERIAL | EXAMPLES OF MATERIAL | PUBLICATIONS |
|---|---|---|
| Spirofluorene compounds | | WO2004093207 |
| Metal phenoxybenzooxazole compounds | | WO2005089025 |
| | | WO2006132173 |
| | | JP200511610 |
| Spirofluorene-carbazole compounds | | JP2007254297 |

TABLE 1-continued
| MATERIAL | EXAMPLES OF MATERIAL | PUBLICATIONS |
|---|---|---|
| | 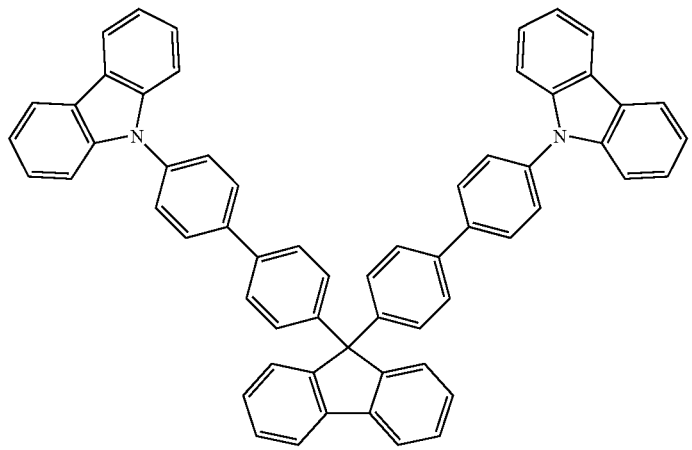 [SMILES: c1ccc2c(c1)-c1ccccc1C2(c1ccc(-c2ccc(-n3c4ccccc4c4ccccc43)cc2)cc1)c1ccc(-c2ccc(-n3c4ccccc4c4ccccc43)cc2)cc1] | JP2007254297 |
| Indolocarbazoles | 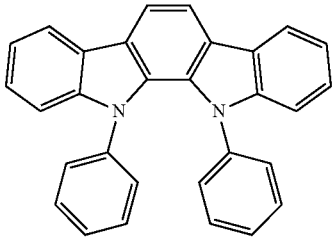 [SMILES: c1ccc(-n2c3ccccc3c3ccc4c5ccccc5n(-c5ccccc5)c4c32)cc1] | WO2007063796 |
| | 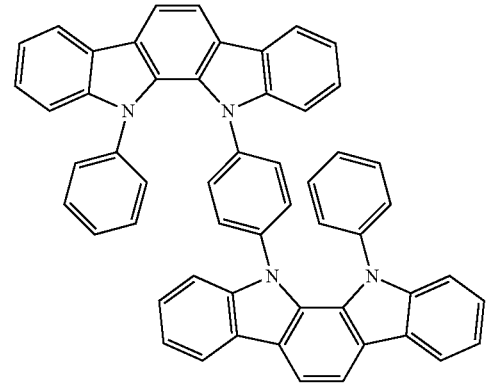 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO2007063754 |
| 5-member ring electron deficient heterocycles (e.g., triazole, oxadiazole) | 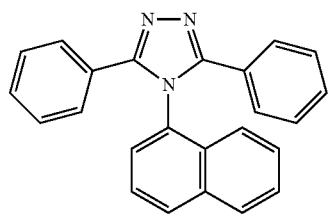 [SMILES: c1ccc(-c2nnc(-c3ccccc3)n2-c2cccc3ccccc23)cc1] | J. Appl. Phys. 90, 5048 (2001) |
| | 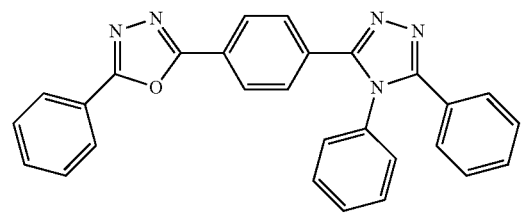 [SMILES: c1ccc(-c2nnc(-c3ccc(-c4nnc(-c5ccccc5)n4-c4ccccc4)cc3)o2)cc1] | WO2004107822 |

TABLE 1-continued

| MATERIAL | EXAMPLES OF MATERIAL | PUBLICATIONS |
| --- | --- | --- |
| Tetraphenylene complexes | | US20050112407 |
| Metal phenoxypyridine compounds | | WO2005030900 |
| Metal coordination complexes (e.g., Zn, Al with N^N ligands) | | US20040137268, US20040137267 |
| Blue hosts | | |
| Arylcarbazoles | | Appl. Phys. Lett, 82, 2422 (2003) |
| | | US20070190359 |

TABLE 1-continued
| MATERIAL | EXAMPLES OF MATERIAL | PUBLICATIONS |
| --- | --- | --- |
| Dibenzothiophene/Di-benzofuran-carbazole compounds | 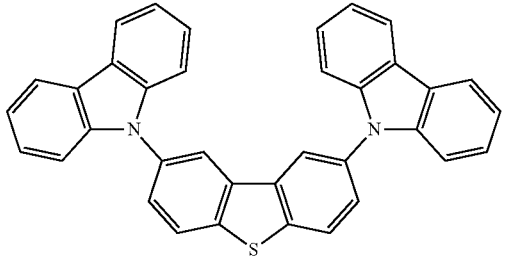 [SMILES: c1ccc2c(c1)c1ccccc1n2-c1ccc2sc3ccc(-n4c5ccccc5c5ccccc54)cc3c2c1] | WO2006114966, US20090167162 |
|  | 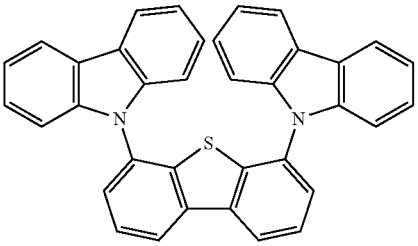 [SMILES: c1cc(-n2c3ccccc3c3ccccc32)c2sc3c(-n4c5ccccc5c5ccccc54)cccc3c2c1] | US20090167162 |
|  | 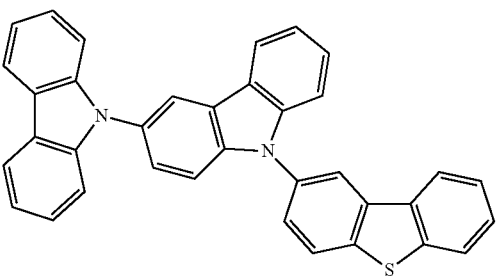 [SMILES: c1ccc2c(c1)sc1ccc(-n3c4ccccc4c4cc(-n5c6ccccc6c6ccccc65)ccc43)cc12] | WO2009086028 |
|  | 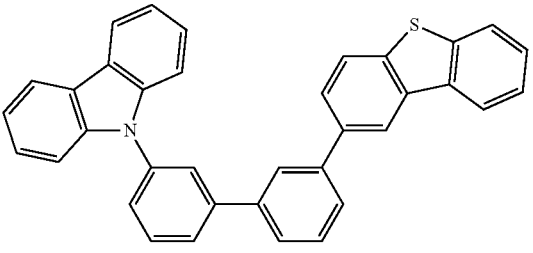 [SMILES: c1cc(-c2cccc(-n3c4ccccc4c4ccccc43)c2)cc(-c2ccc3sc4ccccc4c3c2)c1] | US20090030202, US20090017330 |
| Silicon aryl compounds | 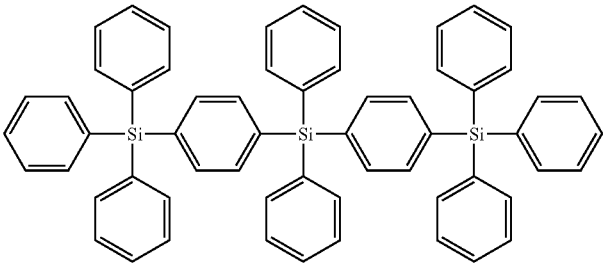 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
|  | 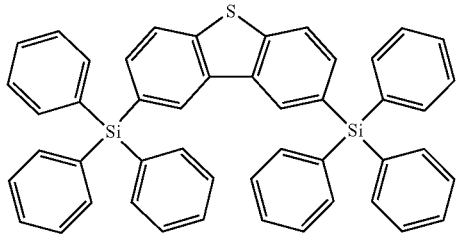 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |

TABLE 1-continued

| MATERIAL | EXAMPLES OF MATERIAL | PUBLICATIONS |
|---|---|---|
| Silicon/Germanium aryl compounds | | EP2034538A |
| Aryl benzoyl ester | | WO2006100298 |
| High triplet metal organometallic complex | | US7154114 |

Phopshorescent dopants
Red dopants

| | | |
|---|---|---|
| Heavy metal porphyrins (e.g., PtOEP) | | Nature 395, 151 (1998) |
| Iridium(III) organometallic complexes | | Appl. Phys. Lett. 78, 1622 (2001) |

TABLE 1-continued

| MATERIAL | EXAMPLES OF MATERIAL | PUBLICATIONS |
|---|---|---|
| | | US2006835469 |
| | | US2006835469 |
| | | US20060202194 |
| | | US20060202194 |
| | | US20070087321 |

TABLE 1-continued

| MATERIAL | EXAMPLES OF MATERIAL | PUBLICATIONS |
|---|---|---|
| | | US20070087321 |
| | | Adv. Mater. 19, 739 (2007) |
| | | WO2009100991 |
| | | WO2008101842 |
| Platinum(II) organometallic complexes | | WO2003040257 |

TABLE 1-continued

| MATERIAL | EXAMPLES OF MATERIAL | PUBLICATIONS |
| --- | --- | --- |
| Osminum(III) complexes | | Chem. Mater. 17, 3532 (2005) |
| Ruthenium(II) complexes | | Adv. Mater. 17, 1059 (2005) |
| Rhenium (I), (II), and (III) complexes | | US20050244673 |

Green dopants

| | | |
| --- | --- | --- |
| Iridium(III) organometallic complexes | and its derivatives | Inorg. Chem. 40, 1704 (2001) |
| | | US20020034656 |

TABLE 1-continued
| MATERIAL | EXAMPLES OF MATERIAL | PUBLICATIONS |
|---|---|---|
| | 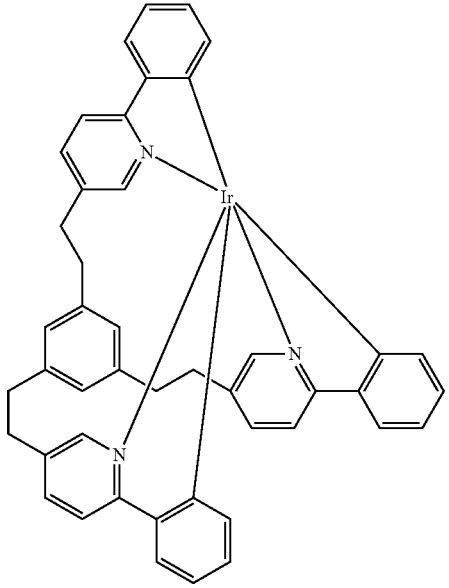 | US7332232 |
| | 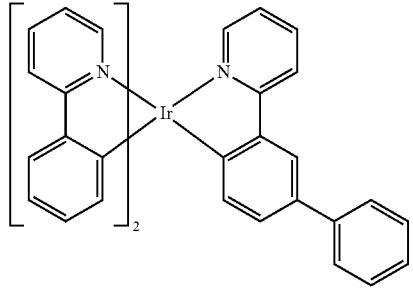 | US20090108737 |
| | 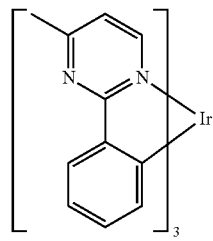 | US20090039776 |
| | 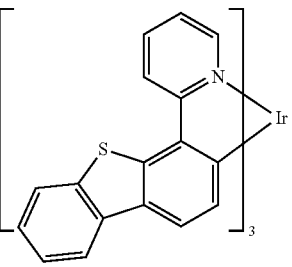 | US6921915 |

TABLE 1-continued

| MATERIAL | EXAMPLES OF MATERIAL | PUBLICATIONS |
|---|---|---|
| | | US6687266 |
| | | Chem. Mater. 16, 2480 (2004) |
| | | US20070190359 |
| | | US 20060008670<br>JP2007123392 |
| | | Adv. Mater. 16, 2003 (2004) |

TABLE 1-continued

| MATERIAL | EXAMPLES OF MATERIAL | PUBLICATIONS |
|---|---|---|
| | | Agnew. Chem. Int. Ed. 2006, 45, 7800 |
| | | WO2009050290 |
| | | US20090165846 |
| | | US20080015355 |
| Monomer for polymeric metal organometallic compounds | | US7250226, US7396598 |

TABLE 1-continued
| MATERIAL | EXAMPLES OF MATERIAL | PUBLICATIONS |
|---|---|---|
| Pt(II) organometallic complexes, including polydenated ligands | 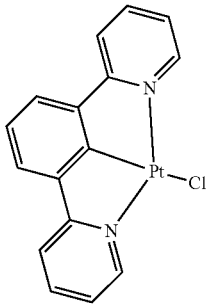 | Appl. Phys. Lett. 86, 153505 (2005) |
| | 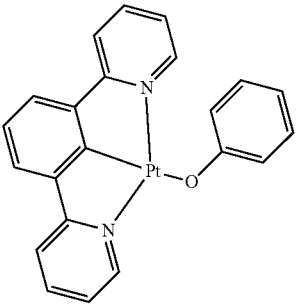 | Appl. Phys. Lett. 86, 153505 (2005) |
| | 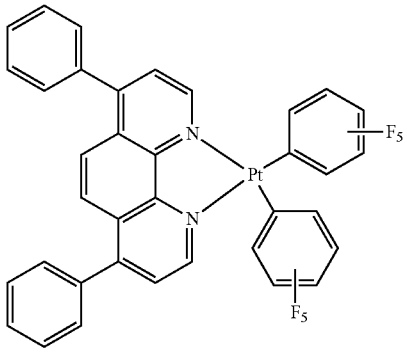 | Chem. Lett. 34, 592 (2005) |
| | 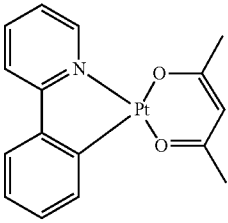 | WO2002015645 |
| | 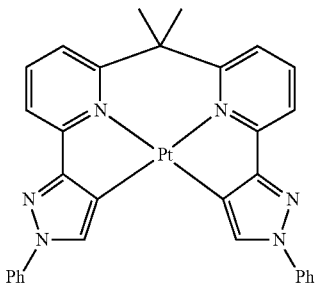 | US20060263635 |

TABLE 1-continued
| MATERIAL | EXAMPLES OF MATERIAL | PUBLICATIONS |
|---|---|---|
| Cu complexes | 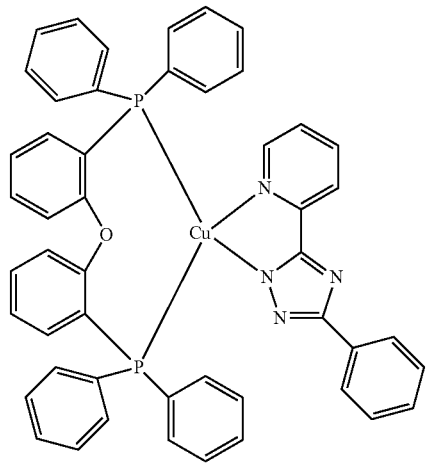 | WO2009000673 |
| Gold complexes | 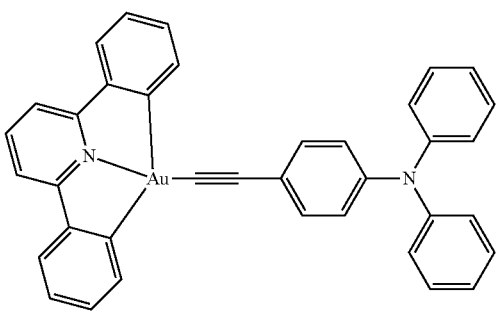 | Chem. Commun. 2906 (2005) |
| Rhenium(III) complexes | 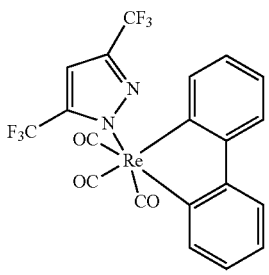 | Inorg. Chem. 42, 1248 (2003) |
| Deuterated organometallic complexes | 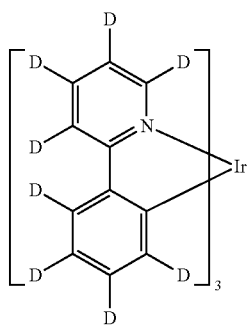 | US20030138657 |

TABLE 1-continued
| MATERIAL | EXAMPLES OF MATERIAL | PUBLICATIONS |
|---|---|---|
| Organometallic complexes with two or more metal centers | 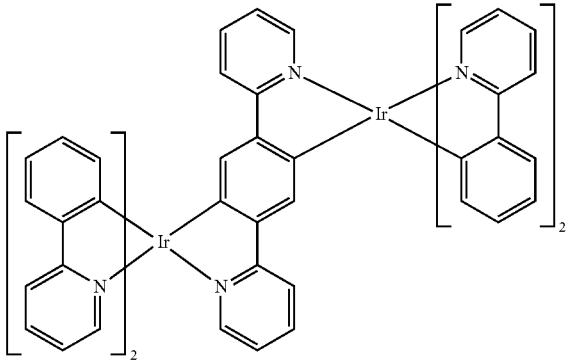 | US20030152802 |
| | 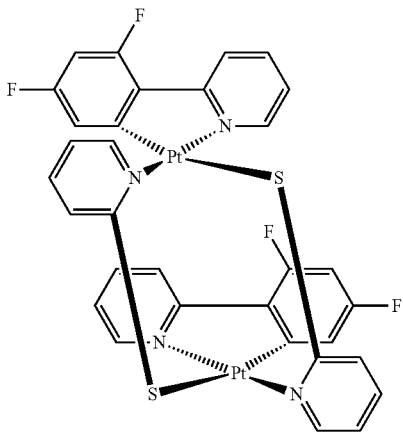 | US7090928 |
| Blue dopants | | |
| Iridium(III) organometallic complexes | 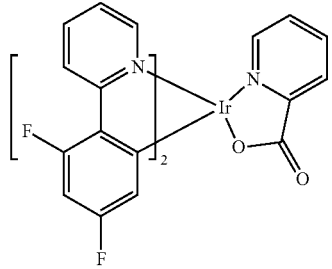 | WO2002002714 |
| | 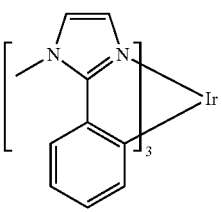 | WO2006009024 |
| | 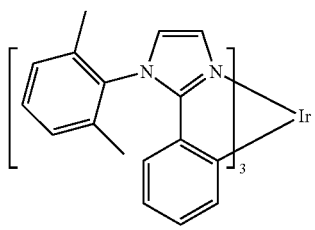 | US20060251923 |

TABLE 1-continued

| MATERIAL | EXAMPLES OF MATERIAL | PUBLICATIONS |
|---|---|---|
| | | US7393599, WO2006056418, US20050260441, WO2005019373 |
| | | US7534505 |
| | | US7445855 |
| | | US20070190359, US20080297033 |
| | | US7338722 |
| | | US20020134984 |

| MATERIAL | EXAMPLES OF MATERIAL | PUBLICATIONS |
|---|---|---|
| | 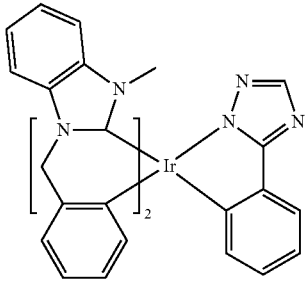 | Agnew. Chem. Int. Ed. 47, 1 (2008) |
| | 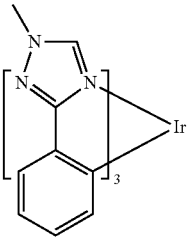 | Chem. Mater. 18, 5119 (2006) |
| | 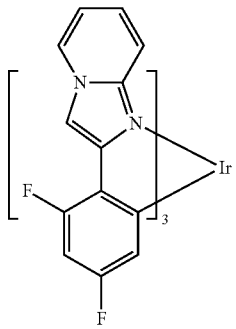 | Inorg. Chem. 46, 4308 (2007) |
| | 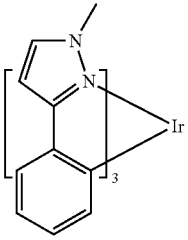 | WO2005123873 |
| | 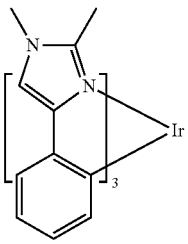 | WO2005123873 |
| | 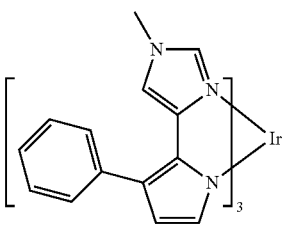 | WO2007004380 |

TABLE 1-continued
| MATERIAL | EXAMPLES OF MATERIAL | PUBLICATIONS |
|---|---|---|
| | 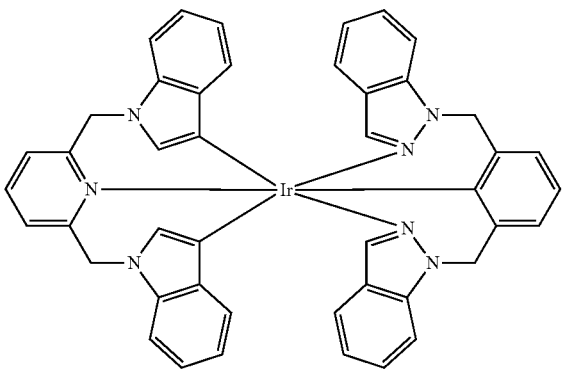 | WO2006082742 |
| Osmium(II) complexes | 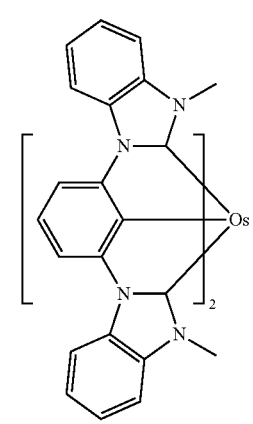 | US7279704 |
| | 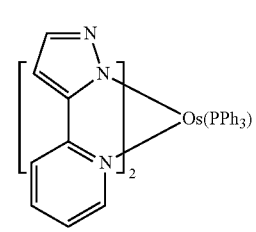 | Organometallics 23, 3745 (2004) |
| Gold complexes | 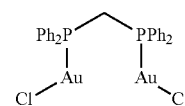 | Appl. Phys. Lett. 74, 1361 (1999) |
| Platinum(II) complexes | 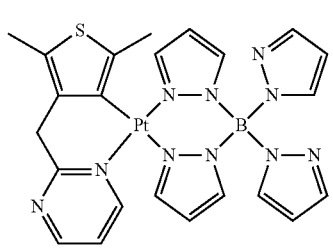 | WO2006098120, WO2006103874 |

TABLE 1-continued
| MATERIAL | EXAMPLES OF MATERIAL | PUBLICATIONS |
|---|---|---|
| *Exciton/hole blocking layer materials* | | |
| Bathocuprine compounds (e.g., BCP, BPhen) | 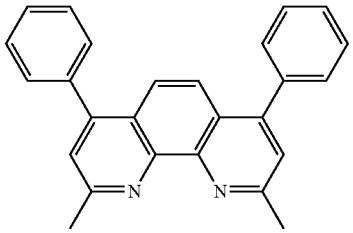 [SMILES: Cc1cc(-c2ccccc2)c2ccc3c(-c4ccccc4)cc(C)nc3c2n1] | Appl. Phys. Lett. 75, 4 (1999) |
|  |  | Appl. Phys. Lett. 79, 449 (2001) |
| Metal 8-hydroxyquinolates (e.g., BAlq) | 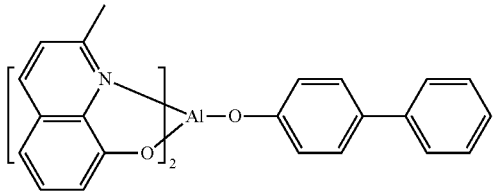 | Appl. Phys. Lett. 81, 162 (2002) |
| 5-member ring electron deficient heterocycles such as triazole, oxadiazole, imidazole, benzoimidazole | 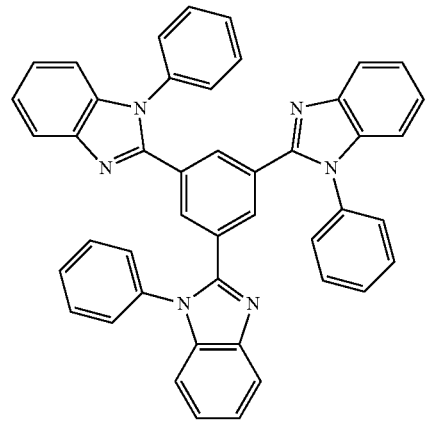 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |

TABLE 1-continued
| MATERIAL | EXAMPLES OF MATERIAL | PUBLICATIONS |
|---|---|---|
| Triphenylene compounds | 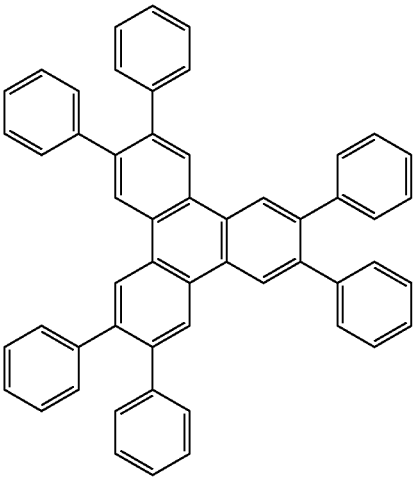 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |
| Fluorinated aromatic compounds | 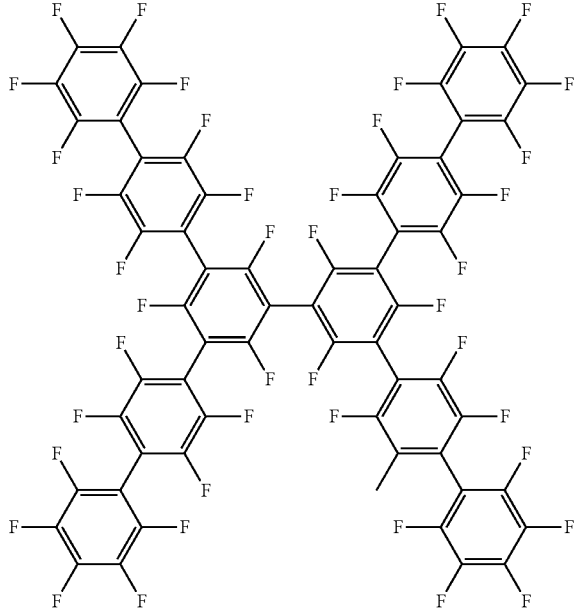 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |
| Phenothiazine-S-oxide | 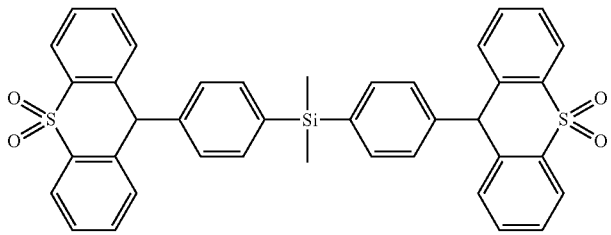 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO2008132085 |

TABLE 1-continued

| MATERIAL | EXAMPLES OF MATERIAL | PUBLICATIONS |
| --- | --- | --- |
| Electron transporting materials | | |
| Anthracene-benzoimidazole compounds | | WO2003060956 |
| | | US20090179554 |
| Aza triphenylene derivatives | | US20090115316 |
| Anthracene-benzothiazole compounds | | Appl. Phys. Lett. 89, 063504 (2006) |
| Metal 8-hydroxyquinolates (e.g. $Alq_3$, $Zrq_4$) | | Appl. Phys. Lett. 51, 913 (1987)<br>US7230107 |

TABLE 1-continued

| MATERIAL | EXAMPLES OF MATERIAL | PUBLICATIONS |
|---|---|---|
| Metal hydroxybenzoquinolates | | Chem. Lett. 5, 905 (1993) |
| Bathocuprine compounds such as BCP, BPhen, etc | | Appl. Phys. Lett. 91, 263503 (2007) |
| | | Appl. Phys. Lett. 79, 449 (2001) |
| 5-member ring electron deficient heterocycles (e.g.,triazole, oxadiazole, imidazole, benzoimidazole) | | Appl. Phys. Lett. 74, 865 (1999) |
| | | Appl. Phys. Lett. 55, 1489 (1989) |
| | | Jpn. J. Apply. Phys. 32, L917 (1993) |

TABLE 1-continued
| MATERIAL | EXAMPLES OF MATERIAL | PUBLICATIONS |
|---|---|---|
| Silole compounds | 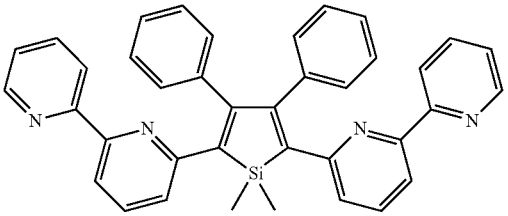 [SMILES: C[Si]1(C)C(c2cccc(-c3ccccn3)n2)=C(c2ccccc2)C(c2ccccc2)=C1c1cccc(-c2ccccn2)n1] | Org. Electron. 4, 113 (2003) |
| Arylborane compounds | 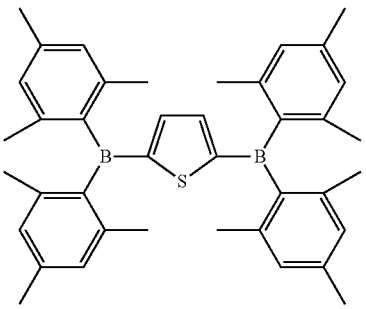 | J. Am. Chem. Soc. 120, 9714 (1998) |
| Fluorinated aromatic compounds | 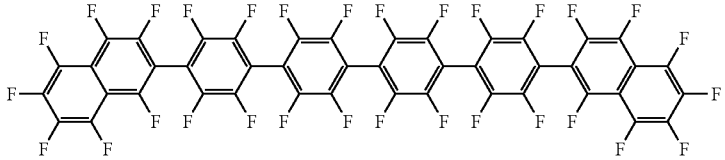 [SMILES: Fc1c(F)c(-c2c(F)c(F)c(-c3c(F)c(F)c4c(F)c(F)c(F)c(F)c4c3F)c(F)c2F)c(F)c(F)c1-c1c(F)c(F)c(-c2c(F)c(F)c(-c3c(F)c(F)c4c(F)c(F)c(F)c(F)c4c3F)c(F)c2F)c(F)c1F] | J. Am. Chem. Soc. 122, 1832 (2000) |
| Fullerene (e.g., C60) | 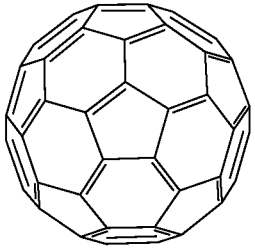 [SMILES: c1cc2c3ccc4c5ccc6c7ccc8c9ccc%10c1c1c2c2c3c4c3c5c6c4c7c8c5c9c%10c1c1c2c3c4c51] | US20090101870 |
| Triazine complexes | 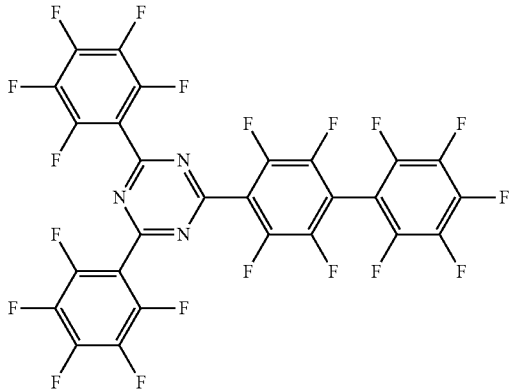 [SMILES: Fc1c(F)c(F)c(-c2nc(-c3c(F)c(F)c(F)c(F)c3F)nc(-c3c(F)c(F)c(-c4c(F)c(F)c(F)c(F)c4F)c(F)c3F)n2)c(F)c1F] | US20040036077 |

TABLE 1-continued

| MATERIAL | EXAMPLES OF MATERIAL | PUBLICATIONS |
|---|---|---|
| Zn (N^N) complexes | 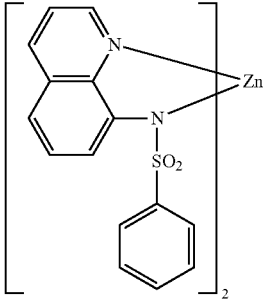 | US6528187 |

EXPERIMENTAL

Several devices were fabricated as follows:

The hole injection layer (HIL) solutions were prepared by mixing the triarylamine derivative and conductivity dopant (mole ratio 1:1 or 2:1) in an organic solvent. Table 2 shows the composition of the HIL solutions. The HIL film was formed by spin coating the HIL solution at various speeds. The film was then baked at 250° C.

TABLE 2

| Organic electron acceptor | Organic electron donor | Mole ratio | Solvent | Total concentration (mg/mL) |
|---|---|---|---|---|
| HIL1 | Compound 1 | Dopant 1 | 1:1 | Cyclohexanone | 15 |
| HIL2 | Compound 2 | Dopant 1 | 1:1 | Cyclohexanone | 15 |
| HIL3 | Compound 2 | Dopant 1 | 2:1 | Cyclohexanone | 13 |

Green-emitting OLEDs were made using HIL1, HIL2, and HIL3 for the hole injection layer. To form the HIL, the solution was spin-coated at 2500 rpm for 60 seconds onto a patterned indium tin oxide (ITO) electrode. The resulting film was baked for 30 minutes at 250° C.

As used herein, the following compounds have the following structures:

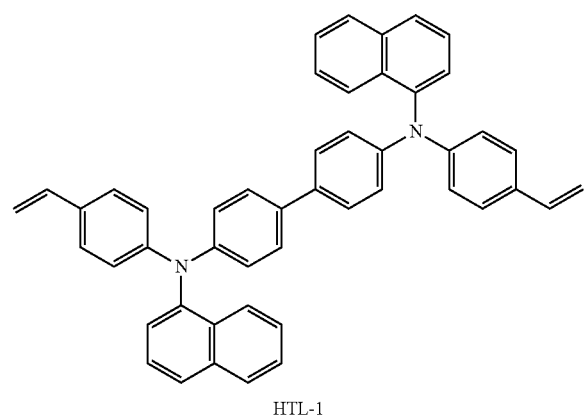

HTL-1

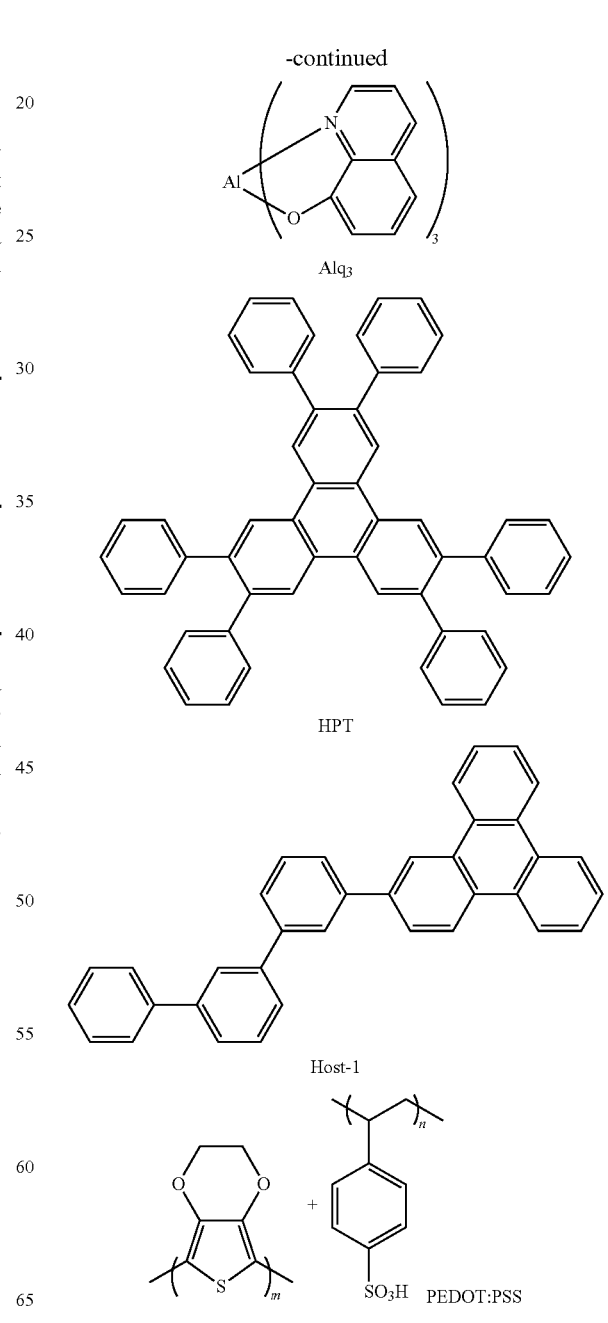

As used herein, Dopant 1 is a mixture of A, B, C, and D in a ratio of 1.9:18.0:46.7:32.8, wherein A, B, C, and D have the following structures:

conditions were same as on ITO. After baking, the HIL1 film was measured. Then, neat toluene solvent was spun on the top of HIL1 film to try wash-off the HIL1 film, which is the same (A)
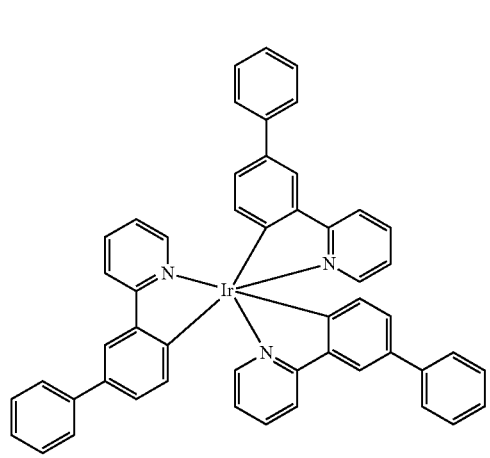

(B)
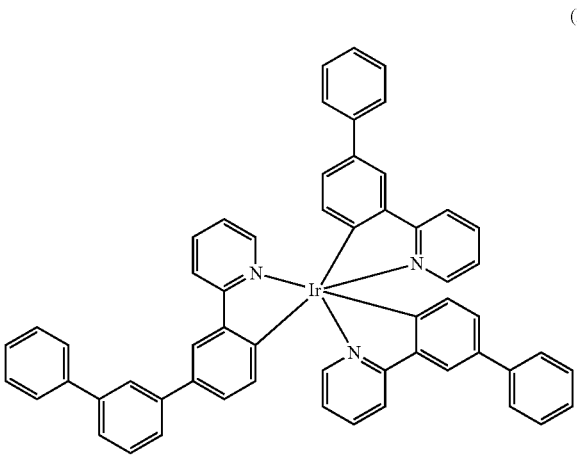

(C)
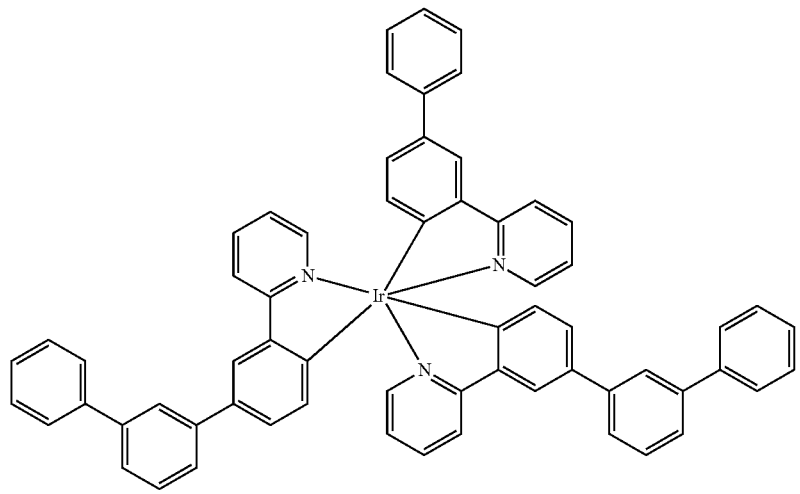

(D)
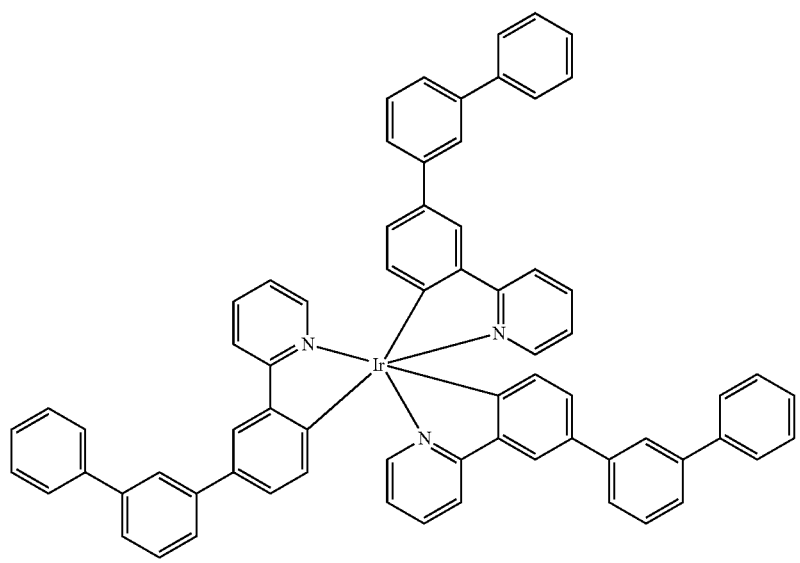

To check the insolubility, the HIL1 solution was spun-coated on the top of a Si-wafer, and the spin and baking as the hole transporting layer (HTL) spin-coating process used in device fabrication. The HIL1 film thickness was measured with 133 Å before washing, and 86 Å after toluene washing. About 60% of the film thickness was left after toluene washing.

A comparative green-emitting device was fabricated using PEDOT:PSS (Baytron, CH8000) as the HIL material. The PEDOT:PSS in an aqueous dispersion was spin-coated at 4000 rpm for 60 seconds onto a patterned indium tin oxide (ITO) electrode. The resulting film was baked for 5 minutes at 200° C.

On top of the HIL, a hole transporting layer (HTL) and then emissive layer (EML) were also formed by spin-coating. The HTL was made by spin-coating a 0.5 wt % solution of the hole transporting material HTL-1 in toluene at 4000 rpm for 60 seconds. The HTL film was baked at 200° C. for 30 minutes. After baking, the HTL became an insoluble film.

The EML was made using Host-1 as the host material and the green-emitting phosphorescent Dopant-1 as the emissive material. To form the EML, a toluene solution containing Host-1 and Dopant-1 (of total 0.75 wt %), with a Host-1: Dopant-1 weight ratio of 88:12, was spin-coated onto the insoluble HTL at 1000 rpm for 60 seconds, and then baked at 100° C. for 30 minutes.

The hole blocking layer (containing the compound HPT), the electron transport layer (containing $Alq_3$), the electron injection layer (containing LiF), and the aluminum electrode were sequentially vacuum deposited.

For performance testing, these green-emitting devices were operated under a constant DC current. FIG. 3 shows a plot of luminance intensity versus time for the devices. The lifetime $LT_{80}$ (as measured by the time elapsed for decay of brightness to 80% of the initial level) were 9 h, 143 h, 87 h, and 131 h for the Comparative, HIL1, HIL2, and HIL3 devices, respectively. The devices with new HIL materials have much longer lifetime than the comparative PEDOT:PSS device.

Table 3 summarizes the performance of the green-emitting devices. As seen in Table 3, the HIL1 device had similar performance in luminous efficiency (39 cd/A) and lower operating voltage (7.8 V) compared to Comparative device (42 cd/A, 8.1 V) at 4000 cd/m². However, HIL2 and HIL3 had lower efficiency and higher voltage than the Comparative device.

TABLE 3

| | Comparative Device | HIL1 Device | HIL2 Device | HIL3 Device |
|---|---|---|---|---|
| Operating Voltage (V) @ 4000 cd/m² | 8.1 | 7.8 | 8.2 | 8.6 |
| Luminous Efficiency (cd/A) @ 4000 cd/m² | 42 | 39 | 20 | 20 |
| Lifetime $LT_{80}$ (hours) from 4000 cd/m² | 9 | 143 | 87 | 131 |
| Color Coordinate CIE 1931 (x, y) | (0.36, 0.60) | (0.33, 0.62) | (0.33, 0.63) | (0.32, 0.63) |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A method of fabricating an organic light emitting device, the method comprising:
   providing an electrode;
   depositing a first organic layer in contact with the electrode by a solution process, wherein the first organic layer comprises an organic electron acceptor; and
   an organic electron donor having the formula:

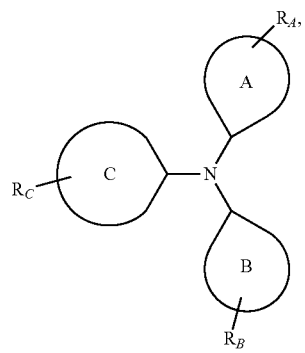

wherein A, B, and C are 5 or 6 membered cyclic or heterocyclic rings;
wherein $R_A$, $R_B$, and $R_C$ are independent selected from the group consisting of hydrogen, halogen, alkyl, alkoxy, amino, alkenyl, alkynyl, aryl and heteroaryl; and
wherein $R_A$, $R_B$, and $R_C$ are optionally fused to A, B, and C; and
wherein at least two of $R_A$, $R_B$, and $R_C$ contain the structure:

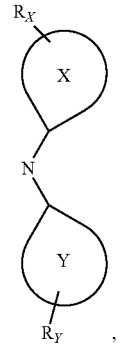

wherein X and Y are independently 5 or 6 membered cyclic or heterocyclic rings;
wherein $R_X$ and $R_Y$ are independent selected from the group consisting of hydrogen, halogen, alkyl, alkoxy, amino, alkenyl, alkynyl, aryl and heteroaryl;
wherein $R_X$ and $R_Y$ are optionally fused to X and Y;
wherein $R_X$ and $R_Y$ are optionally connected to A and B; and
heating the first organic layer to form a layer that is insoluble in a non-polar solvent.

2. The method of claim 1, wherein the non-polar solvent is selected from the group consisting of benzene, carbon tetrachloride, cyclohexane, 1,2-dichloroethane, dichloromethane, di-ethyl ether, heptane, hexane, methyl-t-butyl ether, pentane, di-iso-propyl ether, toluene, and xylene.

3. The method of claim 1, wherein the non-polar solvent is toluene.

4. The method of claim 1, wherein the organic electron donor has the formula:

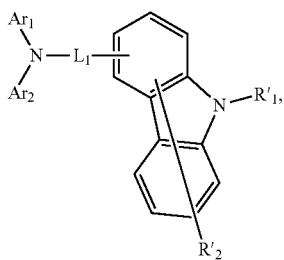

wherein $L_1$ represents a substituted or unsubstituted arylene group having 6 to 60 carbon atoms forming the aromatic ring, a substituted or unsubstituted fluorenylene group, or a substituted or unsubstituted heteroarylene group having 5 to 60 atoms forming a ring; $Ar_1$ and $Ar_2$ each independently represents a substituted or unsubstituted aryl group having 6 to 60 carbon atoms forming the aromatic ring or a substituted or unsubstituted heteroaryl group having 5 to 60 atoms forming a ring; $R'_1$ represents a substituted or unsubstituted aryl group having 6 to 60 carbon atoms forming the aromatic ring; $R'_2$ represents a hydrogen atom, a substituted or unsubstituted aryl group having 6 to 60 carbon atoms forming the aromatic ring, a substituted or unsubstituted alkyl group having 1 to 50 carbon atoms, a substituted or unsubstituted alkoxy group having 1 to 50 carbon atoms, a substituted or unsubstituted aryloxy group having 6 to 50 atoms forming a ring, a substituted or unsubstituted arylthio group having 5 to 50 atoms forming a ring, a substituted or unsubstituted alkoxycarbonyl group having 2 to 50 carbon atoms, an amino group substituted by a substituted or unsubstituted aryl group having 6 to 50 carbon atoms forming the aromatic ring, a halogen atom, a cyano group, a nitro group, a hydroxyl group or a carboxyl group; with the proviso that neither $Ar_1$ nor $Ar_2$ contains a fluorene structure, and that the number of a carbazole structures in the aromatic amine derivative represented by the formula is 1 or 2.

5. The method of claim 1, wherein the organic electron donor has the formula:

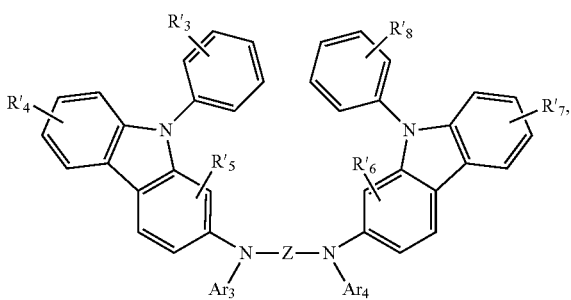

wherein Z is selected from the group consisting of a substituted or unsubstituted C1-C30 alkylene group, a substituted or unsubstituted C2-C30 alkenylene group, a substituted or unsubstituted C6-C30 arylene group, a substituted or unsubstituted C2-C30 heteroarylene group, and a substituted or unsubstituted C2-C30 heterocyclic group; each of $R'_3$, $R'_4$, $R'_5$, $R'_6$, $R'_7$, and $R'_8$ is independently selected from the group consisting of a hydrogen atom, a substituted or unsubstituted C1-C30 alkyl group, a substituted or unsubstituted C1-C30 alkoxy group, a substituted or unsubstituted C6-C30 aryl group, a substituted or unsubstituted C6-C30 aryloxy group, a substituted or unsubstituted C2-C30 heterocyclic group, a substituted or unsubstituted C6-C30 condensed polycyclic group, a hydroxy group, a cyano group, and a substituted or unsubstituted amino group, and, alternatively, two or more adjacent groups among $R'_3$, $R'_4$, $R'_5$, $R'_6$, $R'_7$, and $R'_8$ can be connected to each other to form a saturated or unsaturated carbocycle; and wherein each of $Ar_3$ and $Ar_4$ are independently a substituted or unsubstituted C6-C30 aryl group or a substituted or unsubstituted C2-C30 heteroaryl group.

6. The method of claim 1, wherein the organic electron donor has the formula:

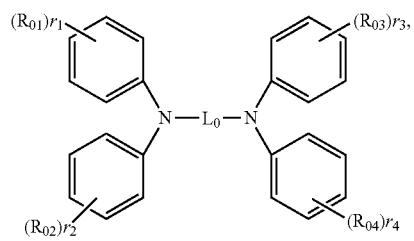

wherein $L_0$ is any one of o-, p-, and m-phenylene groups which have two, three or four rings and which have a substituent with the proviso that when $L_0$ is a phenylene group having four rings, the phenylene group may have an unsubstituted or substituted aminophenyl group somewhere therein, and $R_{01}$, $R_{02}$, $R_{03}$ and $R_{04}$ are any one of the following groups:

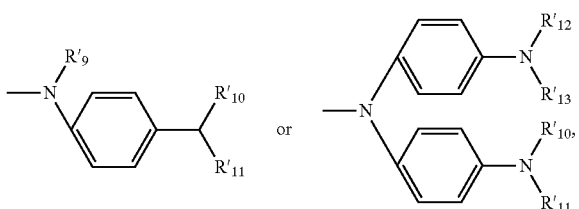

wherein $R'_9$, $R'_{10}$, $R'_{11}$, $R'_{12}$ and $R'_{13}$ are each a substituted or unsubstituted aryl group, and $r_1$, $r_2$, $r_3$ and $r_4$ are each an integer of 0 to 5 with the proviso that $r_1+r_2+r_3+r_4 \geq 1$.

7. The method of claim 1, wherein the electrode is an anode, and the first organic layer is deposited in contact with the anode.

8. The method of claim 1, wherein a second organic layer containing a non-polar solvent is deposited over the first organic layer, and the first organic layer is insoluble to the non-polar solvent in the second organic layer.

9. The method of claim 1, wherein the first organic layer is a hole injection layer.

10. The method of claim 1, wherein the second organic layer is a hole transporting layer, a hole blocking layer, an electron transporting layer, an electron injection layer, or an emissive layer.

11. The method of claim 1, wherein the organic electron acceptor is selected from the group of compounds having the formulas:

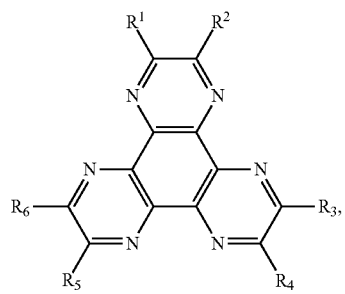

wherein $R_1$, $R_2$, $R_3$, $R_4$, $R_5$, and $R_6$ are independently chosen from the group consisting of hydrogen, halogen, nitrile, nitro, sulfonyl, solfoxide, sulfonamide, sulfonate, trifluoromethyl, ester, amide, straight-chain or branched C1-C12 alkoxy, straight-chain or branched C1-C12 alkyl, aromatic or non-aromatic (substituted or unsubstituted) heterocyclic, substituted or unsubstituted aryl, mono- or di-(substituted or unsubstituted)aryl-amine, and (substituted or unsubstituted)alkyl-(substituted or unsubstituted)aryl-amine; or where $R_1$ and $R_2$, $R_3$ and $R_4$, and $R_5$ and $R_6$ combine form a ring structure including an aromatic ring, a heteroaromatic ring, or a non-aromatic ring, and each ring is substituted or unsubstituted;

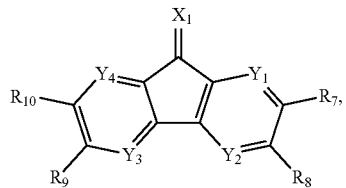

wherein $Y_1$ to $Y_4$ are independently a carbon atom or a nitrogen atom; $R_7$ to $R_{10}$ are independently a hydrogen atom, an alkyl group, a substituted or unsubstituted aryl group, a substituted or unsubstituted heterocycle, a halogen atom, a fluoroalkyl group or a cyano group; $R_7$ and $R_8$, and $R_9$ and $R_{10}$ are independently bonded to form a substituted or unsubstituted aromatic ring or a substituted or unsubstituted heterocycle; $X_1$ is selected from the group consisting of:

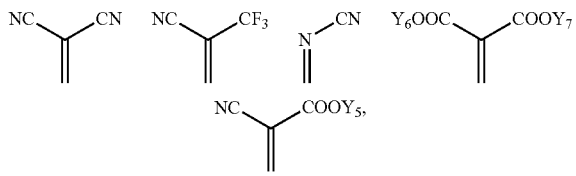

wherein $Y_5$ to $Y_7$ are independently a hydrogen atom, a fluoroalkyl group, an alkyl group, an aryl group or a heterocyclic group; and $Y_6$ and $Y_7$ may form a ring;

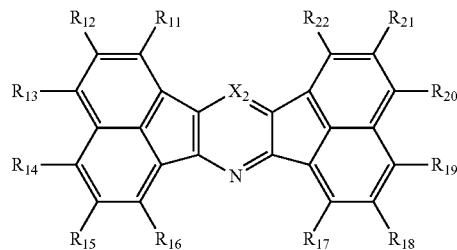

wherein $X_2$ is

wherein $C(R_{23})$ or N, $R_{11}$ to $R_{23}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 40 carbon atoms, a trialkylsilyl group wherein the alkyl group has 1 to 20 carbon atoms and may have a substituent, an aryloxy group wherein the aryl group has 6 to 40 carbon atoms and may have a substituent, a halogen atom, or a cyano group, provided that at least two of $R_{11}$ to $R_{23}$ each represent a cyano group, a trifluoromethyl group or a fluorine atom and that those of $R_{11}$ to $R_{23}$, which are adjacent to one another, may be linked together to form a ring structure;

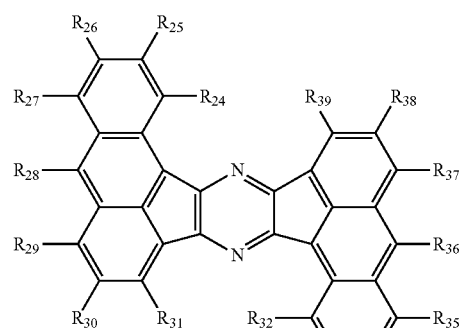

and

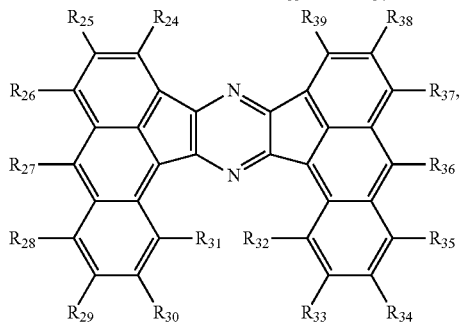

wherein $R_{24}$ to $R_{39}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 40 carbon atoms, a trialkylsilyl group wherein the alkyl group has 1 to 20 carbon atoms and may have a substituent, an aryloxy group wherein the aryl group has 6 to 40 carbon atoms and may have a substituent, a halogen atom, or a cyano group, provided that at least two of $R_{24}$ to $R_{39}$ each represent a cyano group, a trifluoromethyl group or a fluorine atom and that those of $R_{24}$ to $R_{39}$ which are adjacent to one another, may be linked together to form a ring structure;

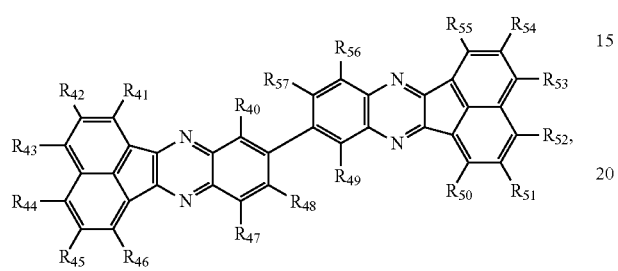

wherein $R_{40}$ to $R_{57}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 40 carbon atoms, a trialkylsilyl group wherein the alkyl group has 1 to 20 carbon atoms and may have a substituent, an aryloxy group wherein the aryl group has 6 to 40 carbon atoms and may have a substituent, a halogen atom, or a cyano group, provided that at least two of $R_{40}$ to $R_{57}$ each represent a cyano group, a trifluoromethyl group or a fluorine atom and that those of $R_{40}$ to $R_{57}$ which are adjacent to one another, may be linked together to form a ring structure; and

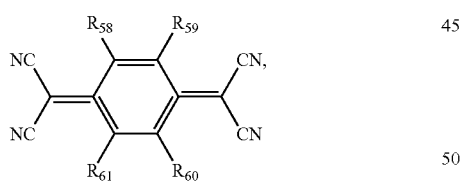

wherein $R_{58}$-$R_{61}$ independently represents hydrogen, fluorine, or substituents independently selected from nitrile (—CN), nitro (—NO$_2$), sulfonyl (—SO$_2$R), sulfoxide (—SOR), trifluoromethyl (—CF$_3$), ester (—CO-DR), amide (—CONHR or —CO—NRR'), substituted or unsubstituted aryl, substituted or unsubstituted heteroaryl, or substituted or unsubstituted alkyl, where R and R' include substituted or unsubstituted alkyl or aryl; or $R_{58}$ and $R_{59}$, or $R_{60}$ and $R_{61}$, combine form a ring structure including an aromatic ring, a heteroaromatic ring, or a non-aromatic ring, and each ring is substituted or unsubstituted.

12. The method of claim 1, wherein the organic electron acceptor is:

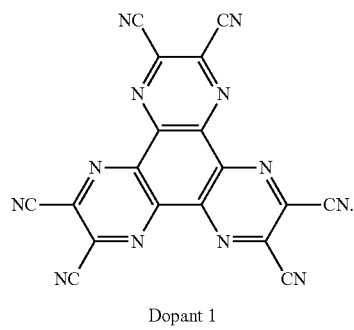 [SMILES: N#Cc1nc2c3nc(C#N)c(C#N)nc3c3nc(C#N)c(C#N)nc3c2nc1C#N]

Dopant 1

13. The method of claim 1, wherein the organic electron donor is selected from the group consisting of:

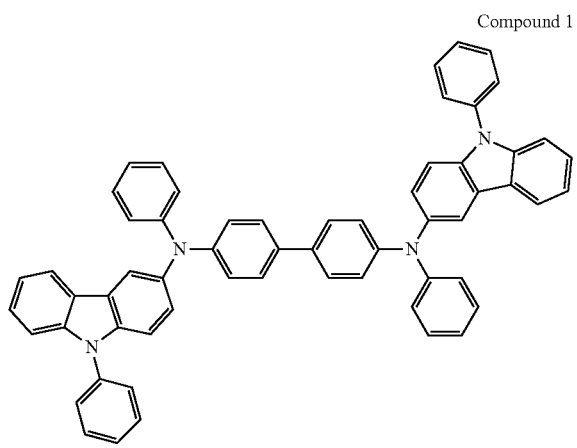

Compound 1

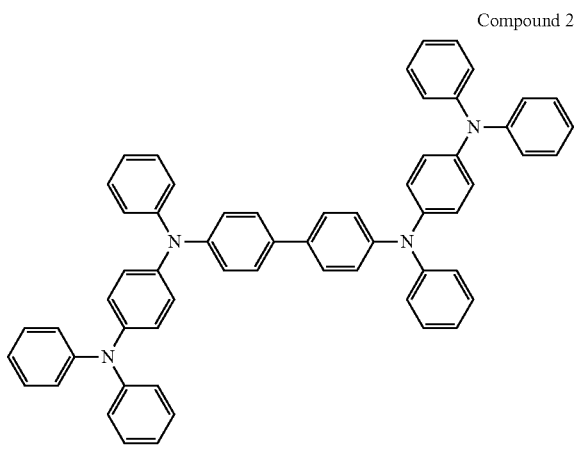

Compound 2

-continued

Compound 3

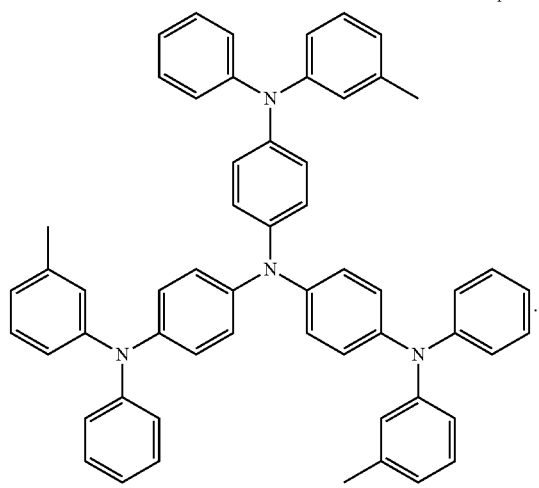

14. The method of claim 1, wherein the organic electron acceptor is:

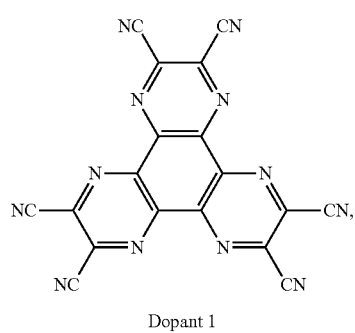

Dopant 1 and
wherein the organic electron donor is selected from the group consisting of:

Compound 1

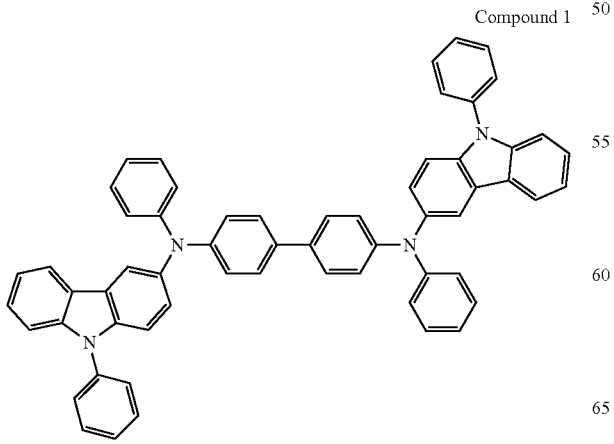

-continued

Compound 2

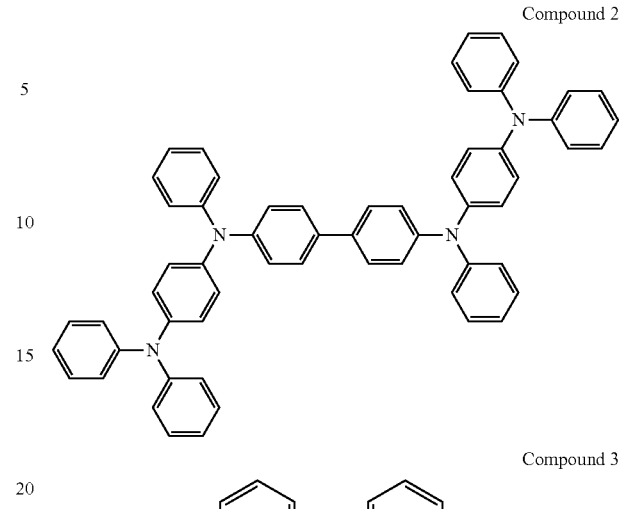

Compound 3

15. The method of claim 14, wherein the organic electron donor is:

Compound 1

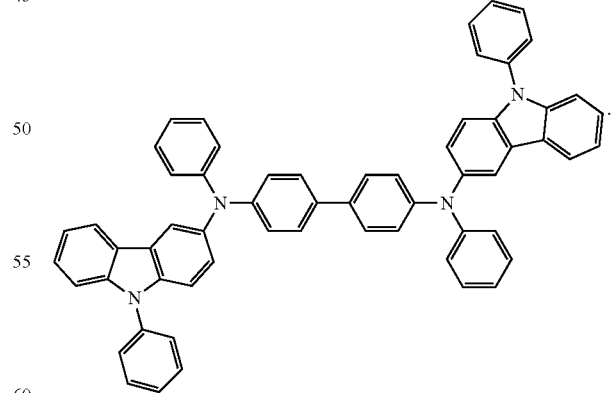

16. The method of claim 1, wherein the solution process is spin coating or inkjet printing.

17. The method of claim 1, wherein the organic electron acceptor and the organic electron donor are mixed at a mole ratio of 1:1 or 2:1.

18. The device of claim 1, wherein the insoluble organic layer forms when the composition is heated at a temperature no less than about 100° C. and no more than about 250° C.

19. A first device comprising an organic light emitting device, further comprising:
an anode;
a cathode; and
a first organic layer disposed between the anode and the cathode, wherein the first organic layer comprises an organic electron acceptor; and
an organic electron donor having the formula:

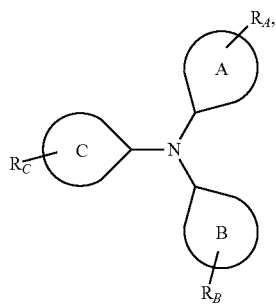

wherein A, B, and C are 5 or 6 membered cyclic or heterocyclic rings;
wherein $R_A$, $R_B$, and $R_C$ are independently selected from the group consisting of hydrogen, halogen, alkyl, alkoxy, amino, alkenyl, alkynyl, aryl and heteroaryl; and
wherein $R_A$, $R_B$, and $R_C$ are optionally fused to A, B, and C; and
wherein at least two of $R_A$, $R_B$, and $R_C$ contain the structure:

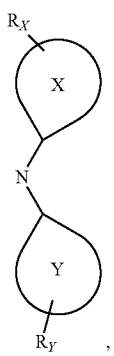

wherein X and Y are independently 5 or 6 membered cyclic or heterocyclic rings;
wherein $R_X$ and $R_X$ are independent selected from the group consisting of hydrogen, halogen, alkyl, alkoxy, amino, alkenyl, alkynyl, aryl and heteroaryl;
wherein $R_X$ and $R_Y$ are optionally fused to X and Y;
wherein $R_X$ and $R_Y$ are optionally connected to A and B; and
wherein the organic electron acceptor and the organic electron donor form an insoluble organic layer when the composition is heated.

20. The device of claim 19, wherein the organic electron acceptor and the organic electron donor form a layer that is insoluble in a non-polar solvent.

* * * * *